US 8,106,799 B1
Jan. 31, 2012

(12) United States Patent
Yang et al.

(10) Patent No.: US 8,106,799 B1
(45) Date of Patent: Jan. 31, 2012

(54) DATA COMPRESSION AND DECOMPRESSION USING PARALLEL PROCESSING

(75) Inventors: Xueshi Yang, Cupertino, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 136 days.

(21) Appl. No.: 12/728,726

(22) Filed: Mar. 22, 2010

Related U.S. Application Data

(60) Provisional application No. 61/162,538, filed on Mar. 23, 2009.

(51) Int. Cl.
*H03M 7/00* (2006.01)

(52) U.S. Cl. ............. 341/107; 341/51; 341/67; 341/89; 341/106

(58) Field of Classification Search .............. 341/51, 341/67, 87, 106, 107
See application file for complete search history.

(56) References Cited

U.S. PATENT DOCUMENTS

| | | | | |
|---|---|---|---|---|
| 5,293,164 | A | * | 3/1994 | Bugajski et al. ............... 341/51 |
| 5,608,396 | A | * | 3/1997 | Cheng et al. .................... 341/50 |
| 5,936,560 | A | * | 8/1999 | Higuchi ........................ 341/106 |
| 6,218,970 | B1 | * | 4/2001 | Jaquette ........................ 341/106 |
| 6,633,244 | B2 | * | 10/2003 | Avery et al. .................... 341/60 |
| 6,876,317 | B2 | * | 4/2005 | Sankaran ...................... 341/107 |
| 6,879,266 | B1 | * | 4/2005 | Dye et al. ........................ 341/51 |
| 7,088,272 | B2 | * | 8/2006 | Nomura ........................ 341/107 |
| 7,283,591 | B2 | * | 10/2007 | Ruehle .......................... 375/253 |
| 7,714,754 | B2 | * | 5/2010 | Girardeau, Jr. ............... 341/107 |
| 2001/0038347 | A1 | * | 11/2001 | Avery et al. .................... 341/51 |
| 2007/0279261 | A1 | * | 12/2007 | Todorov et al. ................ 341/51 |
| 2010/0007534 | A1 | * | 1/2010 | Girardeau, Jr. ............... 341/107 |

* cited by examiner

*Primary Examiner* — Linh Nguyen

(57) ABSTRACT

The present disclosure includes apparatus, systems and techniques relating to pipelined processing. In some implementations, a method performed by a data processing device includes storing data in a memory module. The method includes processing the stored data in accordance with a compression algorithm to produce processed data. Processing the stored data includes pipelined processing of a defined number of symbols of the stored data in parallel, and discarding results of the pipelined processing that are rendered invalid by other results of the pipelined processing. Additionally, the method includes outputting the processed data.

20 Claims, 19 Drawing Sheets

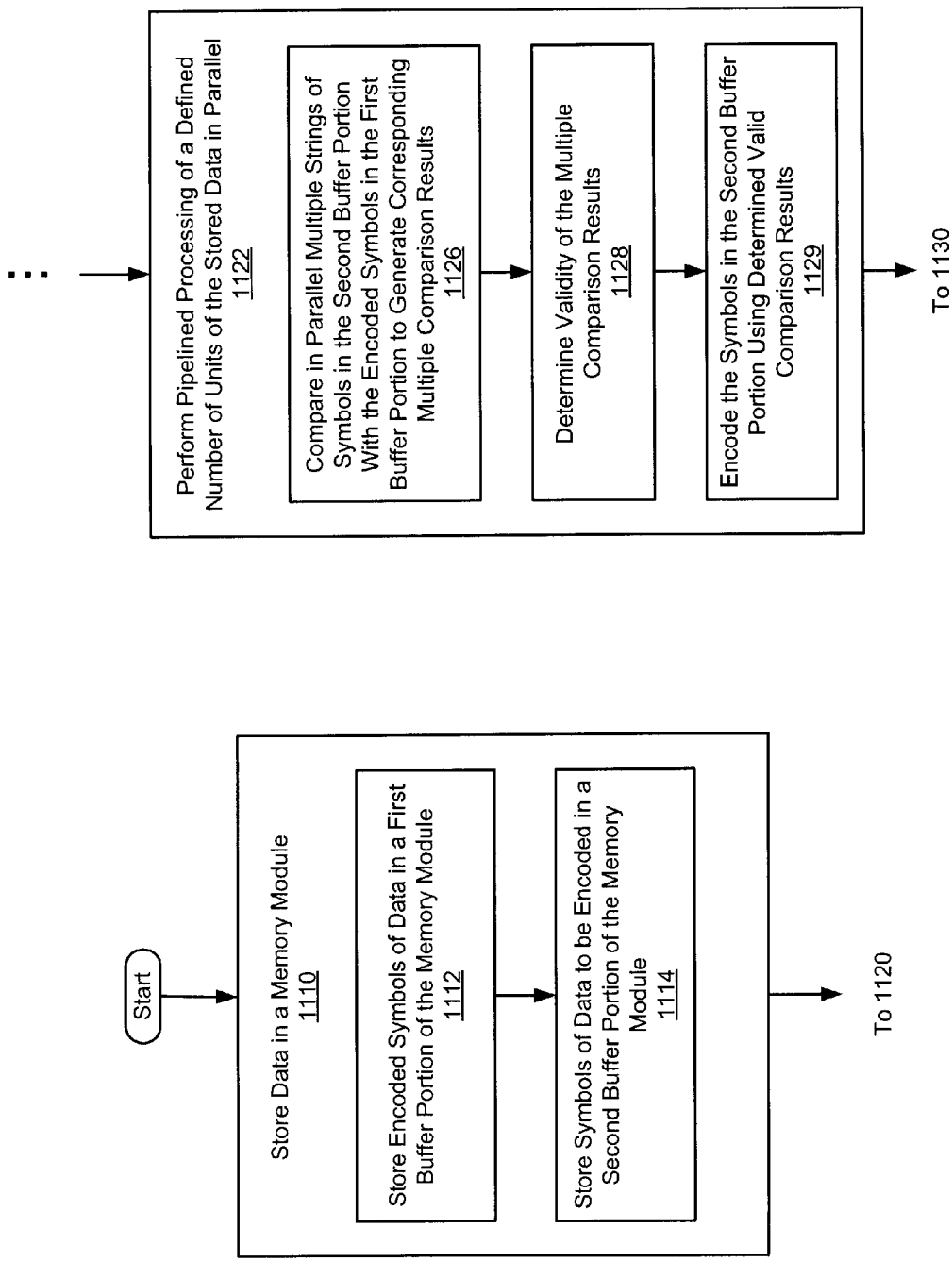

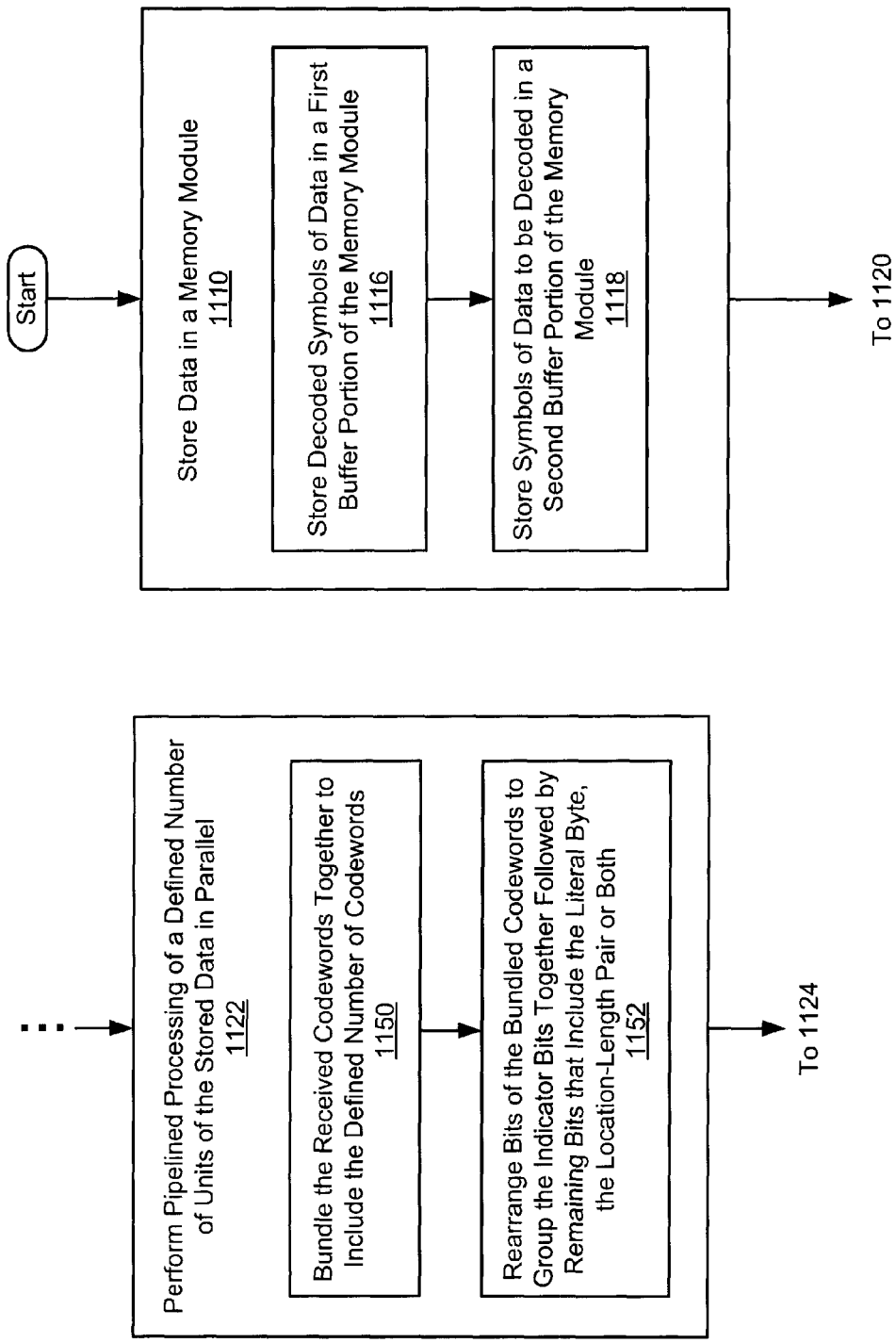

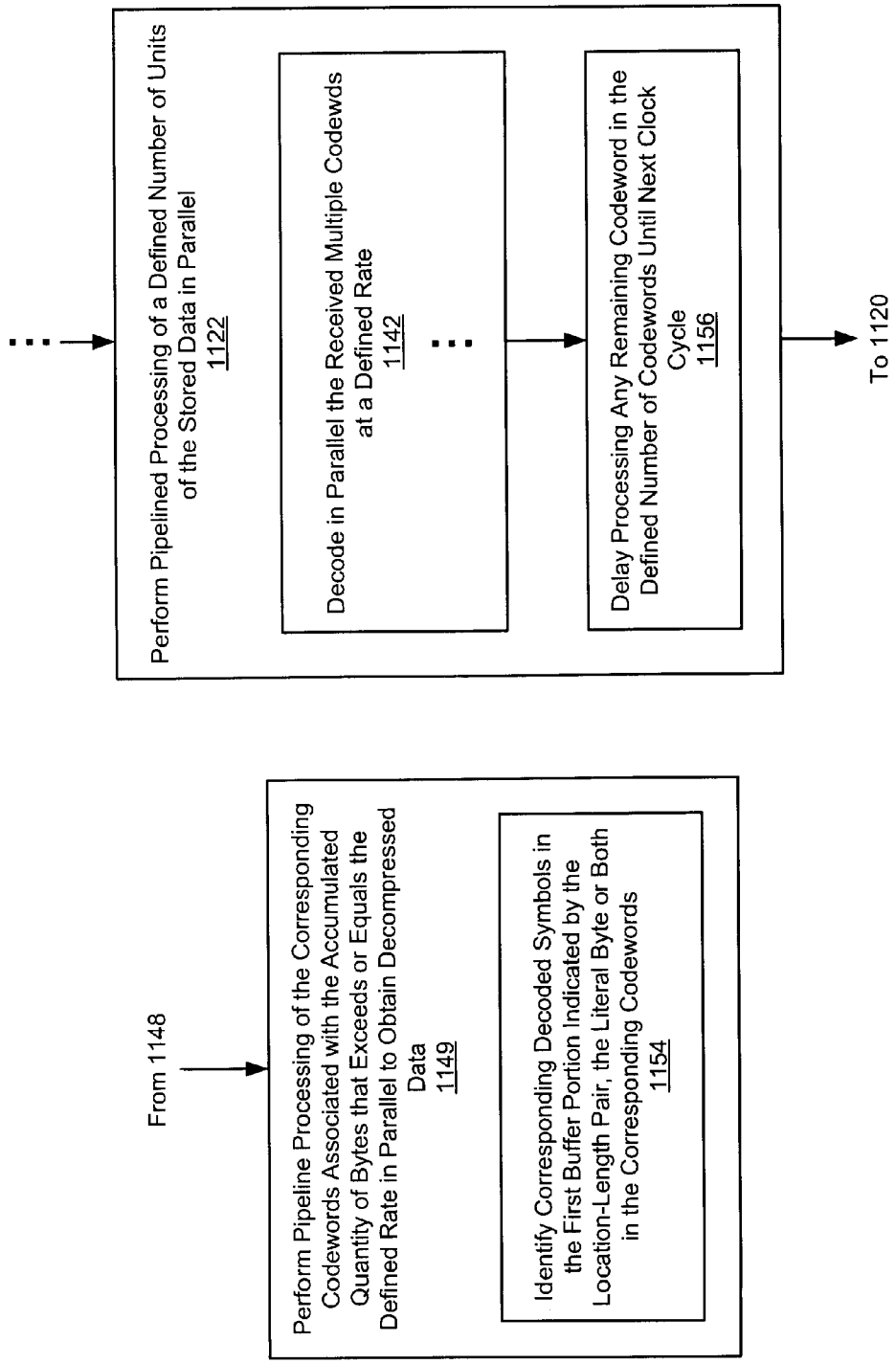

DATA COMPRESSION AND DECOMPRESSION USING PARALLEL PROCESSING

CROSS REFERENCE TO RELATED APPLICATIONS

This application claims the benefit of the priority of U.S. Provisional Application Ser. No. 61/162,538, filed Mar. 23, 2009 and entitled "PARALLEL HIGH SPEED LEMPEL-ZIV DATA COMPRESSION AND DECOMPRESSION WITH FIXED-RATE INTERFACE," the disclosure of which is incorporated in its entirety by reference herein.

BACKGROUND

The present disclosure describes systems, apparatus and techniques relating to data compression technology.

Lossless data compression is a type of data compression that preserves the original data during the compression process. Thus, decompressing or decoding compressed data encoded using a lossless data compression algorithm allows reconstruction of the original data. This is different from lossy data compression, which approximates the original data and causes some loss of data. Lossless data compression is used when deviation from the original data can be critical for a particular application. Conventional lossless data compression algorithms often generate a statistical model for input data, and use the generated model to map the input data to bit sequences so as to have the repeated data generate a shorter output than non-repeated data.

SUMMARY

The present disclosure includes apparatus, systems and techniques relating to pipelined processing for data compression and decompression. An encoder can be configured use parallel processing to enhance data compression. Also, a decoder can be configured to use parallel processing to enhance data decompression. In one aspect, the described systems and apparatus can be implemented as a method performed by a data processing device. The method can include storing data in a memory module. The method can include processing the stored data in accordance with a compression algorithm to produce processed data. The processing can include pipelined processing of a defined number of symbols of the stored data in parallel, and discarding results of the pipelined processing that are rendered invalid by other results of the pipelined processing. Additionally, the method can include outputting the processed data.

Implementations can optionally include one or more of the following features. The storing data in a memory module can include storing encoded symbols of data in a first buffer portion of the memory module, and storing symbols of data to be encoded in a second buffer portion of the memory module. Also, the pipelined processing of a defined number of symbols of the stored data in parallel can include comparing in parallel multiple strings of symbols in the second buffer portion with the encoded symbols in the first buffer portion to generate corresponding multiple comparison results; determining validity of the multiple comparison results, wherein a given comparison result is valid when the given comparison result does not include a symbol encoded using a previous valid comparison result; and encoding the symbols in the second buffer portion using a determined valid comparison result. A quantity of the strings of symbols in the second buffer portion can correspond to a defined rate. A given valid comparison result can include a comparison codeword that identifies one or more symbols to be encoded. The strings of symbols can include different starting positions in the second buffer portion.

Additionally, the method can include bundling the encoded symbols together to include a defined number of codewords; and rearranging bits of the bundled encoded symbols to group indicator bits together followed by remaining bits that include a literal symbol, a location-length pair or both. The storing data in a memory module can include storing decoded symbols of compressed data in a first buffer portion of the memory module; storing symbols of compressed data to be decoded in a second buffer portion of the memory module. The processing the stored data in accordance with a compression algorithm to produce processed data can include receiving multiple codewords associated with the decoded symbols in the first buffer portion. A given codeword can include an indicator bit that indicates whether next data is a literal symbol or a location-length pair that represents a starting location and a length of a pattern of decoded symbols in the first buffer portion to output as decompressed data. The pipelined processing of a defined number of symbols of the stored data in parallel can include decoding in parallel the received multiple codewords at a defined rate. The method can further include selecting a defined number of the received multiple codewords to process in parallel. The defined number of the received multiple codewords can be associated with the defined rate. Additionally, the method can further include identifying a quantity of symbols to be processed for the defined number of codewords; accumulating the identified quantity of symbols to be processed for the defined number of codewords until the accumulated quantity of symbols equals or exceeds the defined rate; and pipelined processing of the corresponding codewords associated with the accumulated quantity of symbols that equals or exceeds the defined rate in parallel to obtain the decompressed data. Outputting the processed data can include outputting the decompressed data obtained by processing the codewords at the defined rate. Pipelined processing of the corresponding codewords associated with the accumulated quantity of symbols that equals or exceeds the defined rate in parallel can include identifying corresponding decoded symbols in the first buffer portion indicated by at least one of the location-length pair or the literal symbol in the corresponding codewords. The pipelined processing of a defined number of symbols of the stored data in parallel can include delaying processing any remaining codeword in the defined number of codewords until a next clock cycle.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

For example, the disclosed embodiments below can be implemented in various systems and apparatus, including, but not limited to, a special purpose data processing apparatus (e.g., a wireless access point, a remote environment monitor, a router, a switch, a computer system component, a medium access unit), a mobile data processing apparatus (e.g., a wireless client, a cellular telephone, a personal digital assistant (PDA), a mobile computer, a digital camera), a general purpose data processing apparatus (e.g., a minicomputer, a server, a mainframe, a supercomputer), or combinations of these.

The described apparatus, systems and techniques can result in one or more of the following advantages. The described compression and decompression techniques can be critical loop (or feedback) free, which allows data input to be shifted into the compressor or shifted out of the decompressor at a defined rate to provide a defined rate interface. The defined rate processing can be implemented by 1) processing every possible search term; (2) using search terms that can be processed with the same buffer window per clock cycle; and (3) using selected search results during compression and making the decision at later pipelined stages, which does not interfere with buffer update (data shift into compressor). In addition, parallel processing of multiple search terms can be implemented to guarantee minimum throughput of more than 1 symbol or byte per clock cycle. The described algorithm can extend to any number of parallel processing degrees to meet desired throughput requirements.

Details of one or more implementations are set forth in the accompanying drawings and the description below. Other features, objects and advantages may be apparent from the description and drawings, and from the claims.

DRAWING DESCRIPTIONS

FIGS. 11A, 11B, 11C, 11D, 11E, 11F, 11G, 11H, 11I, 11J, 11K and 11L are process flow diagrams showing implementations of a process for performing data compression and decompression using pipelined processing.

Like reference symbols in the various drawings indicate like elements.

DETAILED DESCRIPTION

The systems, apparatus and techniques described herein can be implemented as one or more devices, such as one or more integrated circuit (IC) devices (e.g., data communication devices, such as network appliances; computing devices, such as a desktop computer, a server, a laptop, and a smart phone; data storage devices, such as a hard disk drive (HDD), a solid state disk (SSD) drive; and networked data storage devices, such as a Network attached Storage (NAS) device, a Network Interface Card (NIC), etc.) For example, the systems, apparatus and techniques described in this specification can be implemented to perform compression and decompression at a defined rate using pipelined processing of data in parallel.

Lempel-Ziv (LZ) data compression is a lossless compression technique that can be applied to a large class of data sources. LZ data compression can be organized into two categories, LZ77 compression and LZ78 compression. LZ78 compression can be distinguished from LZ77 by its use of an explicit dictionary during compression and decompression.

Figure 1:
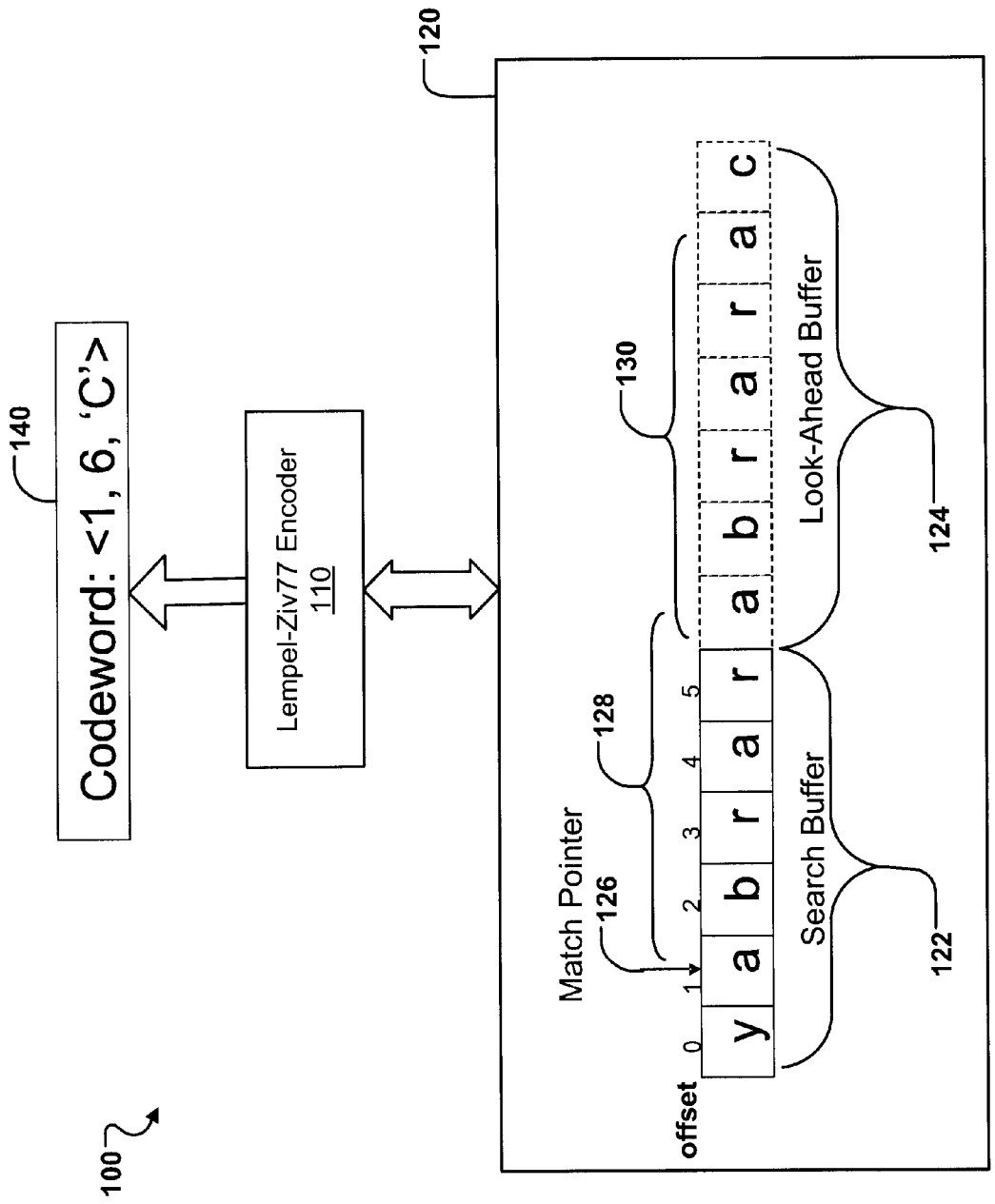
FIG. 1 is a block diagram of an example apparatus for performing Lempel-Ziv77 (LZ77) encoding.

FIG. 1 is a block diagram of an example apparatus for performing LZ77 encoding. The apparatus 100 includes a LZ77 encoder 110 that communicates with a memory module 120, such as a buffer. The buffer 120 can include two structures, a search buffer 122 and a look-ahead buffer 124. The search buffer 122 can store the encoded symbols of desired data, and the look-ahead buffer 124 can store the incoming symbols of the data to be encoded. The search buffer 122 and the look-ahead buffer 124 can be implemented as separate buffers or as a single buffer with multiple portions.

The LZ77 encoder 110 can compare the symbols in the look-ahead buffer 124 with the encoded symbols in the search buffer 122 to identify a pattern of symbols 130 with the longest match. The LZ77 encoder 110 can encode the identified pattern of symbols with a codeword 140. In the example shown in FIG. 1, the pattern of symbols "a b r a r a" 130 in the look-ahead buffer 124 is identified to match the encoded symbols "a b r a r a" 128. The matched pattern of encoded symbols can extend into the look-ahead buffer 124.

The LZ77 encoder 110 can generate the codeword 140 to include three elements as follows: <offset, length, char>. A match pointer 126 points to the starting position of the matched pattern of encoded symbols 128. The offset bits represent a distance of the match pointer 128 (e.g., the beginning of the pattern) from the first symbol in the search buffer 122. The length bits represent a length of the matched pattern of encoded symbols 128. As described above, the length can extend inside the look-ahead buffer 124. The char symbol or byte represents the next un-matched character or symbol in the look-ahead buffer 124. Thus, the matched pattern of symbols 'a b r a r a' can be encoded with a codeword <1, 6, 'c'>. The offset bit of '1' indicates that the beginning of the pattern is 1 symbol or byte away from the first symbol in the search buffer 122. The length symbol or byte of '6' indicates that the length of the matched pattern is 6 symbols. The char symbol or byte of 'c' indicates that the next unmatched symbol is 'c.'

Figure 2:
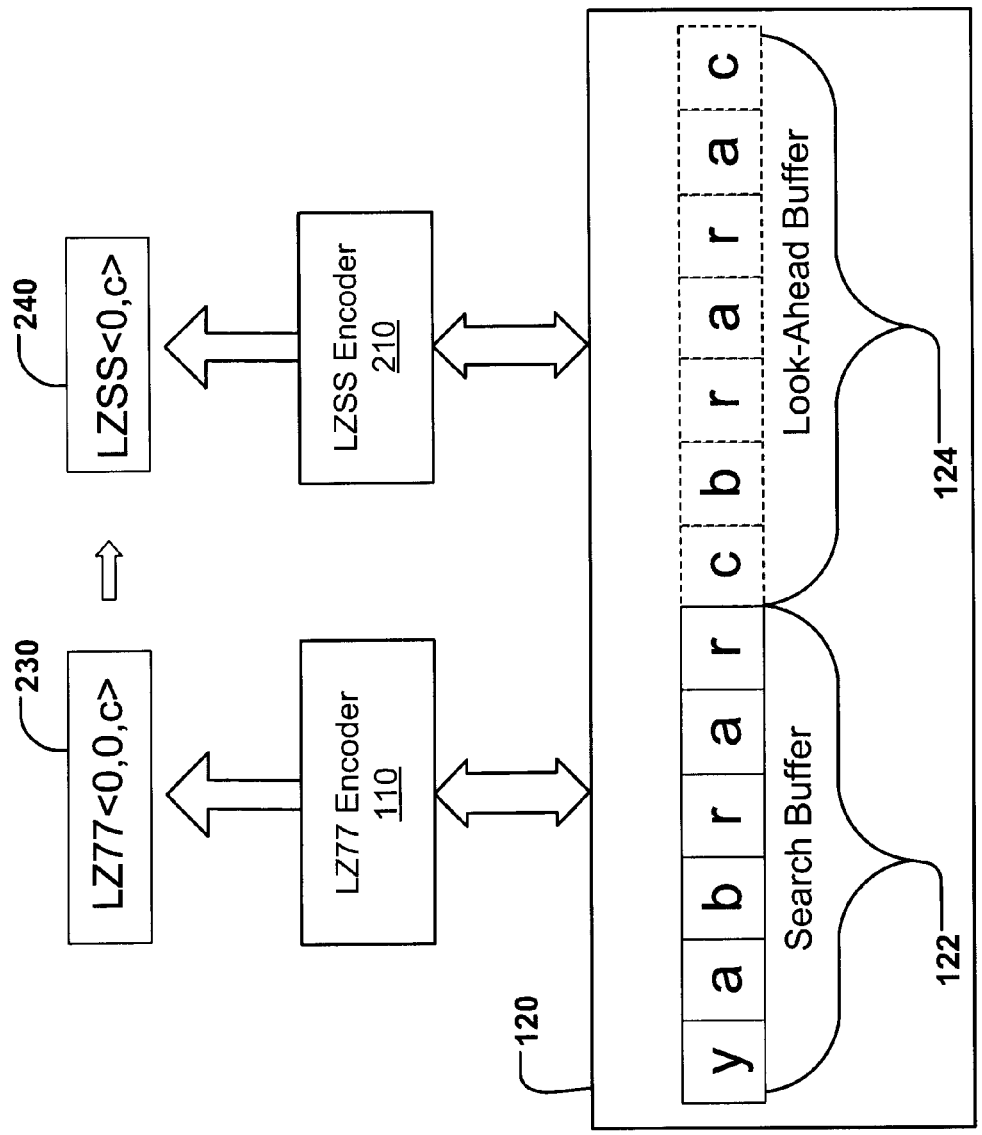
FIG. 2 is a block diagram that compares LZ77 encoding and Lempel-Ziv-Storer-Szymanski (LZSS) encoding.

FIG. 2 is a block diagram that compares LZ77 encoding and Lempel-Ziv-Storer-Szymanski (LZSS) encoding. LZSS encoding is a variant of the LZ77 encoding. LZSS encoding can eliminate a situation where a triple element codeword is used to encode a single character or symbol. For example, the symbol 'c' does not appear in the search buffer 122 of the memory module 120. An LZ77 encoder 110 can encode the symbol 'c' with a codeword <0,0,'c'> 230, which uses more than 8 bits.

Compared to the triple element codeword used by the LZ77 encoder 110, an LZSS encoder 210 can encode the same symbol 'c,' with a two element codeword <0, c> 240. The first element of the LZSS codeword 240 is a one-bit flag to indicate whether the next chunk of data is a literal (e.g., symbol or byte) or an offset-length pair. The second element of the LZSS codeword 240 is either a literal (e.g., symbol or byte) or an offset-length pair depending on the value of the flag. For example, when the LZSS encoder 210 does not find a match for the current symbol (e.g., 'c') in the search buffer 122, the LZSS encoder 210 outputs an LZSS codeword that includes the elements <0, char>. The '0' flag indicates that a match was not found. Then the second element is a literal (e.g., symbol or byte), which in this case is the symbol 'c'. The encoded LZSS codeword <0, c> is 9-bits long.

When the LZSS encoder 210 identifies a match for the current symbol in the search buffer 122, the LZSS encoder 210 outputs an LZSS codeword that includes the elements <1, offset, length>. The flag value of '1' indicates that a pattern of symbols in the look-ahead buffer 124 was matched with the same pattern of encoded symbols in the search buffer 122. The element 'length' represents the length of the matched pattern of symbols, and the element 'offset' represents the starting position of the pattern of symbols matched in the search buffer 122.

The different types of LZ data compression techniques can be described as variable-rate-in and variable-rate-out algorithms. Traditionally, LZ data compression algorithms experience low throughput due to the constraints in their critical feedback loop, where the input rate is dependent upon previous processing results. For example, the throughput for a traditional LZ data compression technique can be as low as 1 symbol or byte per clock cycle.

Figure 3:
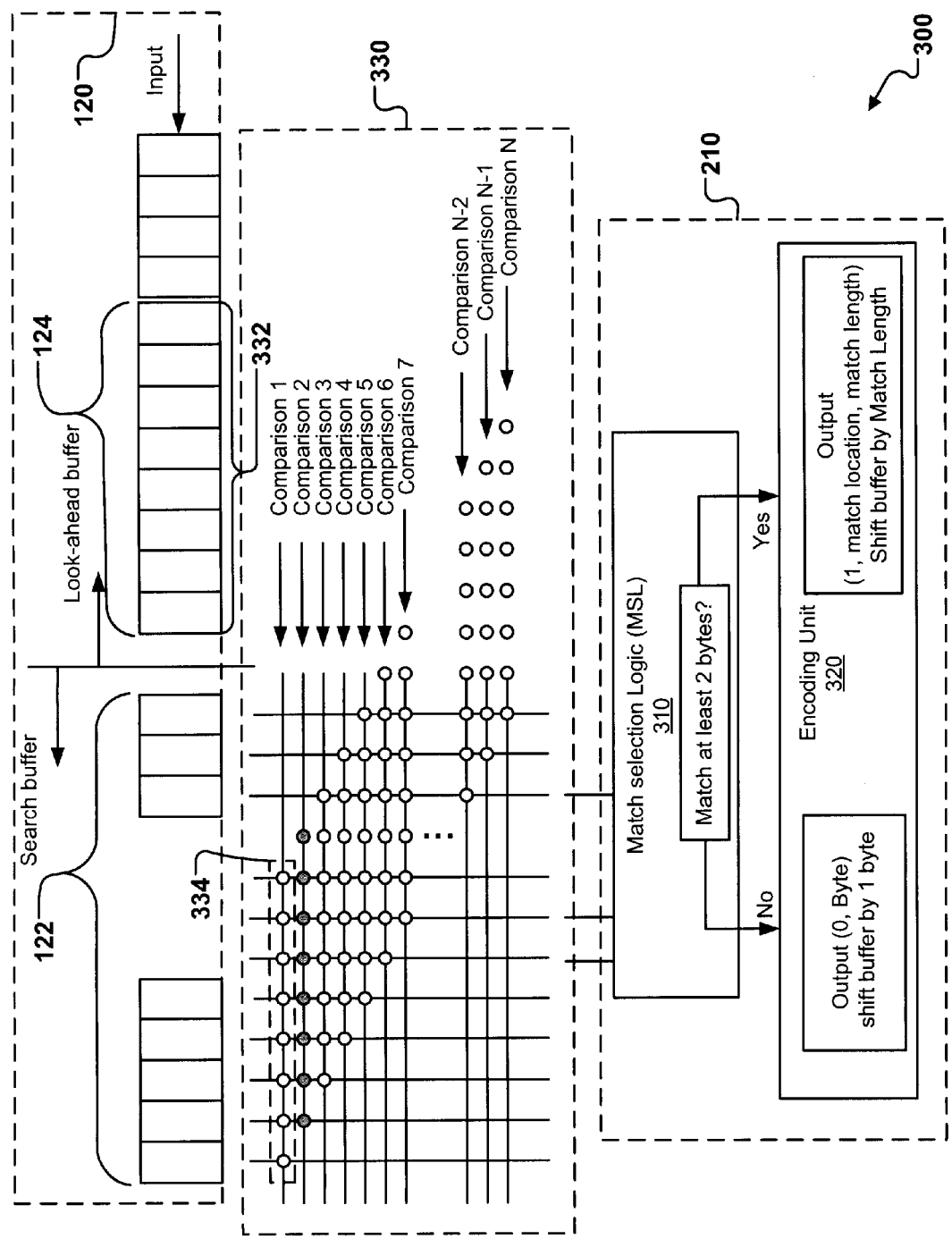
FIG. 3 is a block diagram showing a variable-rate-in compression system based on LZSS data compression.

FIG. 3 is a block diagram showing a variable-rate-in compression system based on LZSS data compression. In the variable-rate-in compression system 300, the throughput or the amount of input data shift depends on the processing results from the previous clock cycle. This dependency of the throughput on the previous data processing forms a critical loop in the variable-rate-in compression system 300. For example, if during the previous clock cycle, at least two symbols or bytes are not matched, an LZSS encoder 210 shifts the search buffer 122 and the look-ahead buffer 124 by 1 symbol or byte during the current clock cycle.

The variable-rate-in compression system 300 includes an LZSS encoder 210 encoding data stored in a memory module 120. The LZSS encoder 210 compares the encoded symbols in the search buffer 122 with the input symbols to be encoded in the look-ahead buffer 124 of the memory module 120. During each clock cycle, a match selection logic (MSL) 310 of the LZSS encoder 210 determines the longest match between the symbols in the look-ahead buffer 124 and the encoded symbols in the search buffer 122. An encoding unit 320 can communicate with the MSL 310 to encode the symbols using the match determined by the MSL 310.

When the MSL 310 identifies at least two symbol or bytes that match, the encoding unit 320 can encode the matched symbols with a corresponding codeword: <1, match location, match length> and shifts or updates the search buffer 122 and the look-ahead buffer 124 by the match length. For example, when five symbols or bytes match, then the search buffer 122 is updated by five symbols or bytes. As described above, the first element, '1' is a flag to indicate that a match has been found.

When the MSL 310 fails to identify at least two symbols or bytes that match, the encoding unit 320 can encode the symbols with a corresponding codeword: <0, byte> and shifts or updates the search buffer 122 by one byte. The first element, '0' is a flag to indicate that a match was not found (or that only 1 symbol or byte matched). The second element, 'byte,' is the unmatched literal symbol or byte.

Additionally, FIG. 3 shows N rows of N comparisons 330 that can be made by the LZSS encoder 210 for each search term considered. Each search term is considered one at a time. For example, a search term 332 of 8 symbol or bytes in length can be compared with the encoded symbols in the search buffer 122 eight symbol or bytes at a time. The LZSS encoder 210 can start with a string of eight symbols 334 represented by eight open circles. The first open circle in the string of symbols represents the starting position of the string of symbols in the search buffer 122 that the comparison covers. For the first comparison, the LZSS encoder 210 can start with the first position in the search buffer 122. For each subsequent comparison, the starting position of the string of symbols can be shifted by at least one symbol or byte. By continuously shifting the starting position, each subsequent comparison can cover at least one new symbol in the search buffer 122 until all encoded symbols are considered. After the search term 332 has been encoded, the LZSS encoder 210 updates the search buffer 122 and the look-ahead buffer 124 by the length of the match. The encoder 210 then moves on to process other search terms in the look-ahead buffer 120 one at a time until all of the symbols have been encoded.

As described above, the number of symbols encoded per clock cycle depends on the number of symbols or bytes matched by the MSL 310. The buffer updates (or shift amounts) are determined by the match length output from the previous codeword. In other words, the look-ahead buffer 124 starts with the first unmatched byte (or symbol) from the previous search and the matching symbols or bytes (if there are any) are shifted into the search buffer 122. Thus, the LZSS encoder 210 is a variable-in compressor. Similarly, an LZSS decoder is a variable-out decompressor.

Figure 4:
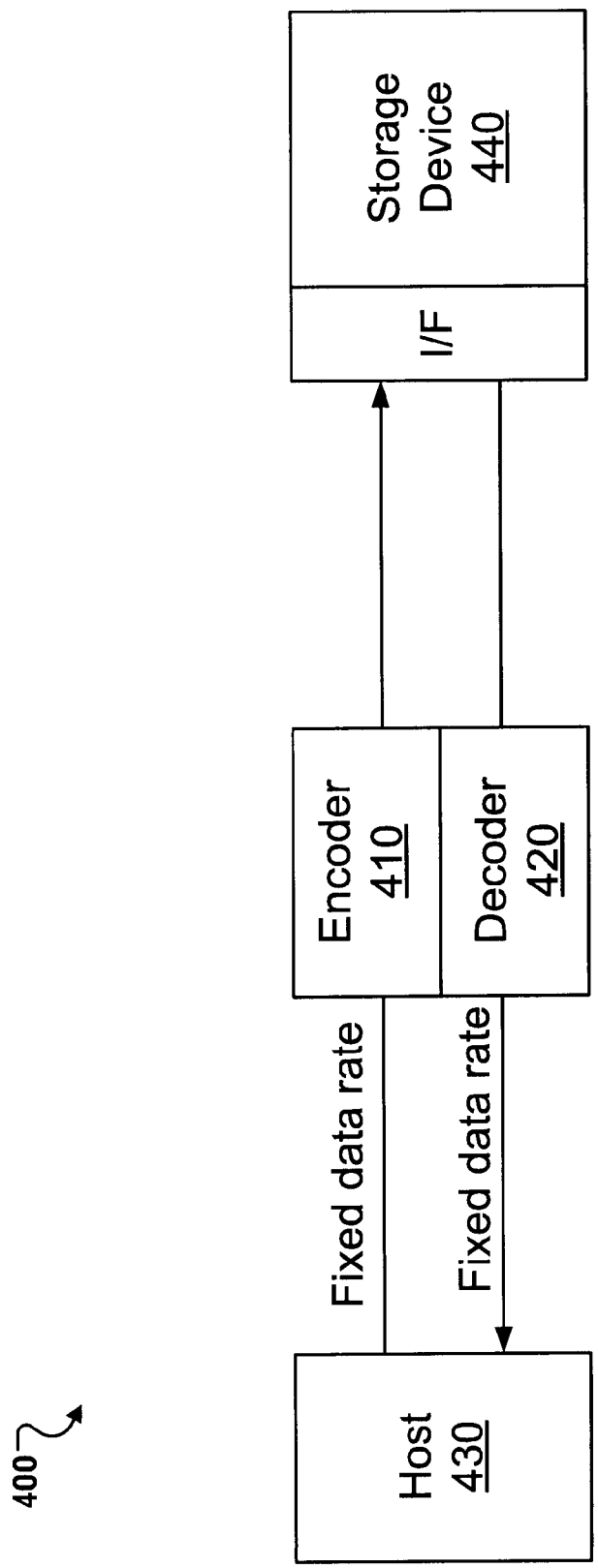
FIG. 4 is a block diagram of a system for processing data at a defined rate.

FIG. 4 shows a block diagram of a system for processing data at a defined rate greater than one symbol or byte per clock cycle (e.g., a fixed rate selected from a range of 2 bytes to 16 bytes per clock cycle, depending on the application requirements). The system 400 can provide an interface having a defined rate data compression and decompression for many applications, such as data storage applications. The system 400 includes an encoder 410 and a decoder 420 that performs pipelined processing at a defined rate. In addition, the described encoder 410 and decoder 420 can process multiple symbols or bytes per clock cycle at the minimum to provide a guaranteed throughput rate.

The encoder 410 receives data from a host 430 to be encoded. The host 430 can include various devices, such as a desktop computer, a server, a group of computing devices in a network, a portable computing device, a data capture device (e.g., a digital camera, a digital music player), and etc. The encoder 410 can receive data at a defined rate for compression. The encoded data can be stored at a storage device 440.

The corresponding decoder 420 can decompress the encoded data in the storage device 440 and output the decompressed data at a defined rate of at least two symbols or bytes per clock cycle (e.g., a fixed rate selected from a range of 2 symbols or bytes to 16 bytes per clock cycle) similar to the compression rate. The decompressed data can be provided to the host 430 to obtain the original data.

Figure 5:
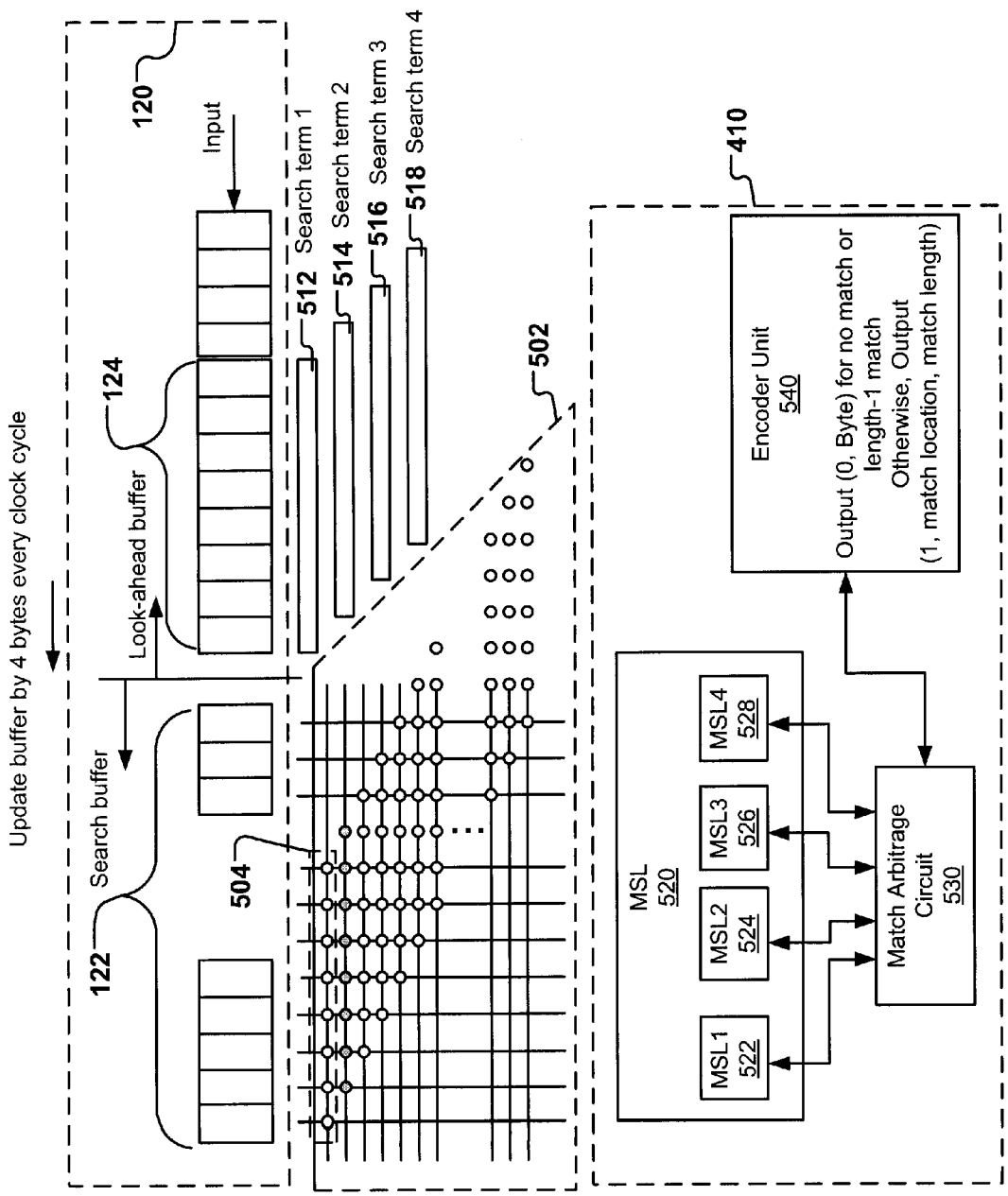
FIG. 5 is a block diagram showing a process for performing data compression at a defined rate with high speed parallelization.

FIG. 5 is a block diagram showing a process for performing data compression at a defined rate with high speed parallelization. For many high speed applications, the throughput requirements can be multiples of the clock frequency when the circuit is running. For example, 9.6 Gb/s throughput with 400 Mhz clock requires a circuit to process at least 3 symbols or bytes at a time (400*3*8 Mb/s=9.6 Gb/s). The encoder 410 can be implemented to provide parallel or pipelined processing. Parallel processing can allow the encoder 410 to delay buffer updates, which can speed up the encoding process. Because search operations are carried out with a slightly outdated buffer in parallel, some search results may not be used to encode the symbols in the look-ahead buffer 124.

FIG. 5 shows the encoder 410 that compresses 4 symbol or byte per clock cycle. However, the encoder 410 can be implemented to have any desired degree of defined parallel processing and throughput rate of at least two symbols or bytes per clock cycle (e.g., a fixed rate selected from a range of 2 symbols or bytes to 16 symbols or bytes per clock cycle). The amount of input data shift performed by the encoder 410 using parallel or pipelined processing is independent of the previous processing results. Thus, the encoder 410 is free of the critical feedback loop that can slow down throughput.

FIG. 5 shows the encoder 410 encoding data stored in a memory module 120. The encoder 410 compares the encoded symbols in the search buffer 122 with the input symbols to be encoded in the look-ahead buffer 124 of the memory module 120. The search buffer 122 and the look-ahead buffer 124 can be implemented as separate buffers or as different regions of a single buffer. During each clock cycle, a match selection logic (MSL) or a comparison logic 520 of the encoder 410 determines the longest match between the symbols in the look-ahead buffer 124 and the encoded symbols in the search buffer 122. The MSL 520 includes multiple comparison logic units or MSL units 522, 524, 526 and 528 to process multiple search terms 512, 514, 516 and 518 in parallel and output comparison results corresponding to the search terms 512, 514, 516 and 518. The number of MSL units and the search terms correspond to the defined rate of decompression. Because FIG. 5 shows a 4 symbols or bytes per clock cycle example, four MSL units and four search terms are shown. Independent of the comparison results of the MSL units 522, 524, 526 and 528, the encoder 410 updates the search buffer 122 and the look-ahead buffer 124 by a defined amount or rate, such as 4 symbols or bytes per clock cycle.

For the 4-byte or symbol per clock example shown in FIG. 5, four comparison results are available per clock cycle. The comparison results are associated with corresponding search terms having four different starting positions in the look-ahead buffer 124. The comparison results of the MSL units 522, 524, 526 and 528 can include a codeword of <0, b> that indicates one or zero matching symbol or byte ('0') and an attached literal symbol or byte ('b'). The comparison results can include a codeword of <1, location, length> to indicate at least two matching symbols or bytes ('1') at a location ('location') in the search buffer 122 with a match length of 'length' symbols or bytes. The maximum match length can be limited by the look-ahead buffer length. In the example shown in FIG. 5, the look-ahead buffer length is 8 symbols or bytes.

A match arbitrage circuit (MAC) 530 can communicate with the MSL units 522, 524, 526 and 528 of the MSL 520 to identify the comparison results as either valid or invalid. If a comparison result (e.g., output from any MSL units 522, 524, 526 or 528) contains any data that has been encoded by a previous valid comparison result, the comparison result is identified as an invalid result. Otherwise, the comparison result is identified as a valid result.

For example, at clock cycle k, the MSL units 522, 524, 526 and 528 may generate the following comparison results: <1, 20, 2>, <1, 30, 2>, <0, 'C'>, <1, 2, 8>. The first comparison result covers 2 symbols or bytes, Byte 0 and Byte 1 and is valid. The second comparison covers 2 bytes, Byte 1 and Byte 2. Because byte 1 is already encoded by the first comparison result, the second comparison result is invalid. The third comparison result covers one symbol or byte, Byte 3. Because Byte 3 was not covered by a previous comparison result, the third comparison result is valid. The fourth comparison result covers eight symbols or bytes, Byte 4 through Byte 11. Because Byte 4 through Byte 11 were not covered by a previous comparison result, the fourth comparison result is valid.

An encoder unit 540 can communicate with the MAC 530 to use the valid comparison results to encode the symbols in the look-ahead buffer 124 with corresponding codewords: <flag, byte> or <flag, match location, match length>. An invalid result is not used to encode the symbols in the look-ahead buffer 124. When a valid comparison result identifies at least two symbols or bytes that match, the encoding unit 540 can encode the matched symbols with a corresponding codeword: <1, match location, match length>. When a valid comparison result identifies zero or one symbol or byte that match, the encoding unit 540 can encode the compared symbol(s) with a corresponding codeword: <0, byte>. Thus, a codeword is generated for each valid comparison result.

Additionally, FIG. 5 shows N rows of N comparisons 502 that can be made by the encoder 410 for the search terms 512, 514, 516 and 518 in parallel. For example, the search terms 512, 514, 516 and 518 of 8 symbols or bytes in length each can be compared in parallel with the encoded symbols in the search buffer 122 eight symbols or bytes at a time. A string of eight symbols in the search buffer 122 are represented by eight consecutive open circles 504. The first open circle represents the starting position of the string of symbols in the search buffer 122 that the comparison covers.

For the first comparison, the encoder 410 can start with the first position in the search buffer 122. For each subsequent comparison, the starting position of the string of symbols can be shifted by at least one symbol or byte. By continuously shifting the starting position, each comparison can cover at least one new symbol in the search buffer 122 until all encoded symbols are considered. After the search terms 512, 514, 516, 518 have been compared in parallel, the encoder 410 can use the valid comparison result(s) to encode the symbols that correspond to the valid comparison(s). The encoder 410 encodes the symbols with corresponding codewords that indicate at least the length of a matching pattern of symbols. The encoder 410 can update the search buffer 122 and the look-ahead buffer 124 by four symbols or bytes and independent of the comparison results.

For example, when each of the four comparison results shows zero or one symbol or byte matching, the encoder 410 can update four total symbols or bytes (one for each comparison result). In another example, the comparison result for the first search term 512 can indicate eight symbols or bytes that match (e.g., the length of the look-ahead buffer 124). Because all of the symbols are encoded using the first comparison result, the remaining three comparison results (for the remaining three search terms 514, 516 and 518) are invalid and are not used to encode the symbols. The encoder 410 updates the search buffer 122 and the look-ahead buffer 124 four symbols or bytes per clock cycle two consecutive times.

In other examples, the four comparison results can indicate 5, 6 or 7 matching symbols. For example, the comparison result for the first search term can indicate five matching symbols. The comparison results for the second, third and fourth search terms are invalid because they include symbols encoded by the first search term. The encoder 410 updates and shifts the search buffer 122 and the look-ahead buffer by 4 symbols or bytes in one clock cycle. The encoder 410 delays updating and shifting the residual one matching symbol or byte until the next clock cycle. On the next clock cycle, four additional search terms can be used starting at the one residual symbol or byte. The first comparison result is invalid because it includes the residual symbol or byte encoded by the previous valid comparison result. The MSL units determine whether the remaining three comparison results are valid. The valid comparison results are used to encode the corresponding symbols. In some implementations, the four search terms in the next clock cycle can start with the $6^{th}$ symbol or byte because the $5^{th}$ symbol or byte was already encoded by the previous valid comparison result.

The encoder 410 can relax the starting positions of the pattern of symbols in the search buffer 122 that match the search terms for the 4 parallel comparisons. For example, the starting position of the pattern of symbols in the search buffer 122 that match the second search term need not be subsequent to the starting position of the pattern of symbols in the search buffer 122 that match the first search term. Similarly, the starting position of the pattern of symbols that match the third search term need not be subsequent to the starting positions of the patterns of symbols that match the first and second search terms. The same concept applies to the fourth search term.

Figure 6:
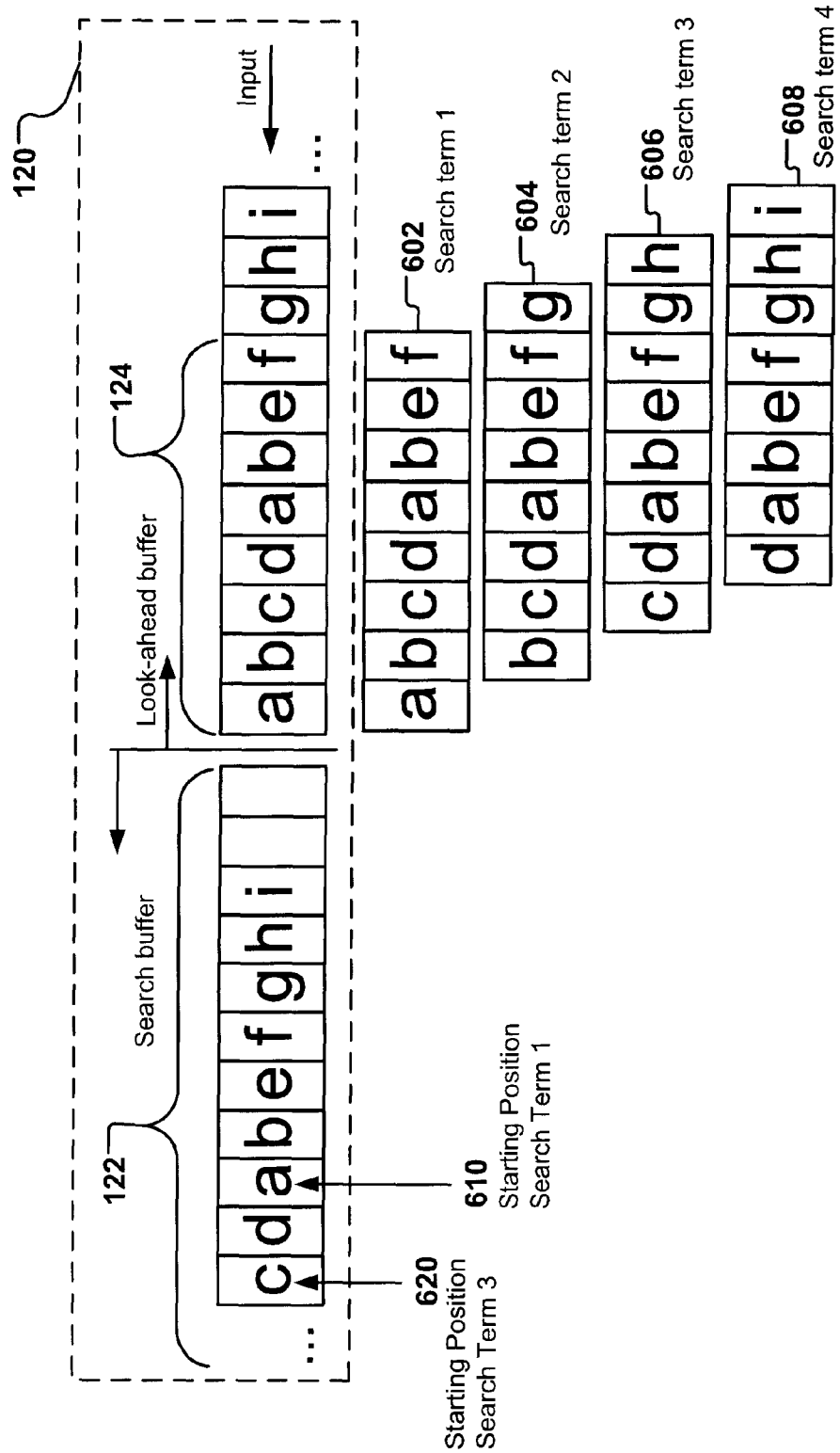
FIG. 6 is a block diagram showing flexible starting positions of patterns of symbols in a search buffer that match different search terms.

FIG. 6 is a block diagram showing flexible starting positions of patterns of symbols in a search buffer that match different search terms. A memory module 120 includes a look-ahead buffer 124 that receives input data of 'a b c d a b e f g h i' symbols. An encoder (e.g., encoder 410) can compare in parallel the four search terms 602, 604, 606 and 608 with the encoded symbols in the search buffer 122. In performing the comparisons in parallel, the starting positions of the matching encoded symbols can be located anywhere in the search buffer 122. The first symbol in the first search term 602 is the symbol 'a.' The first symbol in the third search term 606 is the symbol 'c.' The starting position 610 of the pattern of encoded symbols that match the first search term 602 is located two positions after the starting position 620 of the pattern of encoded symbols that match the third search term 606.

Lossless data compression allows the original data to be recovered by decompressing the encoded data. Decoding or decompression is the opposite operation of encoding or compression. An LZ decompressor decodes the encoded data one codeword at a time. For example, while the input buffer is not empty, an LZSS decoder first parses the first bit of a codeword. When the first bit is it indicates no match and that the next chunk of data is a literal symbol or byte. The LZSS decoder outputs the next symbol or byte from the codeword and shifts the buffer by 1 symbol or byte. Then the LZSS decoder decodes the next codeword. When the first bit '1,' it indicates a match and that the next chunk of data is a location-length pair (G, L). The LZSS decoder outputs 'L' symbols or bytes starting at buffer position 'G.' The LZSS decoder shifts the buffer by 'L' symbols or bytes and decodes the next codeword. Thus, the LZSS decoder is a variable-rate decoder that changes the amount of buffer shift based on the result of codeword processing.

Parallel processing can be extended to perform parallel data decoding. For example, the decoder 420 is able to decode up to 4 codewords at a time, guaranteeing minimum throughput of 4F symbols or Bytes/second, where F is the clock frequency. Additionally, the decoder 420 can perform parallel decoding using heuristic decoding operation. The decoder 420 discards incorrect heuristic decoding results caused by an unsynchronized buffer.

Figure 7:
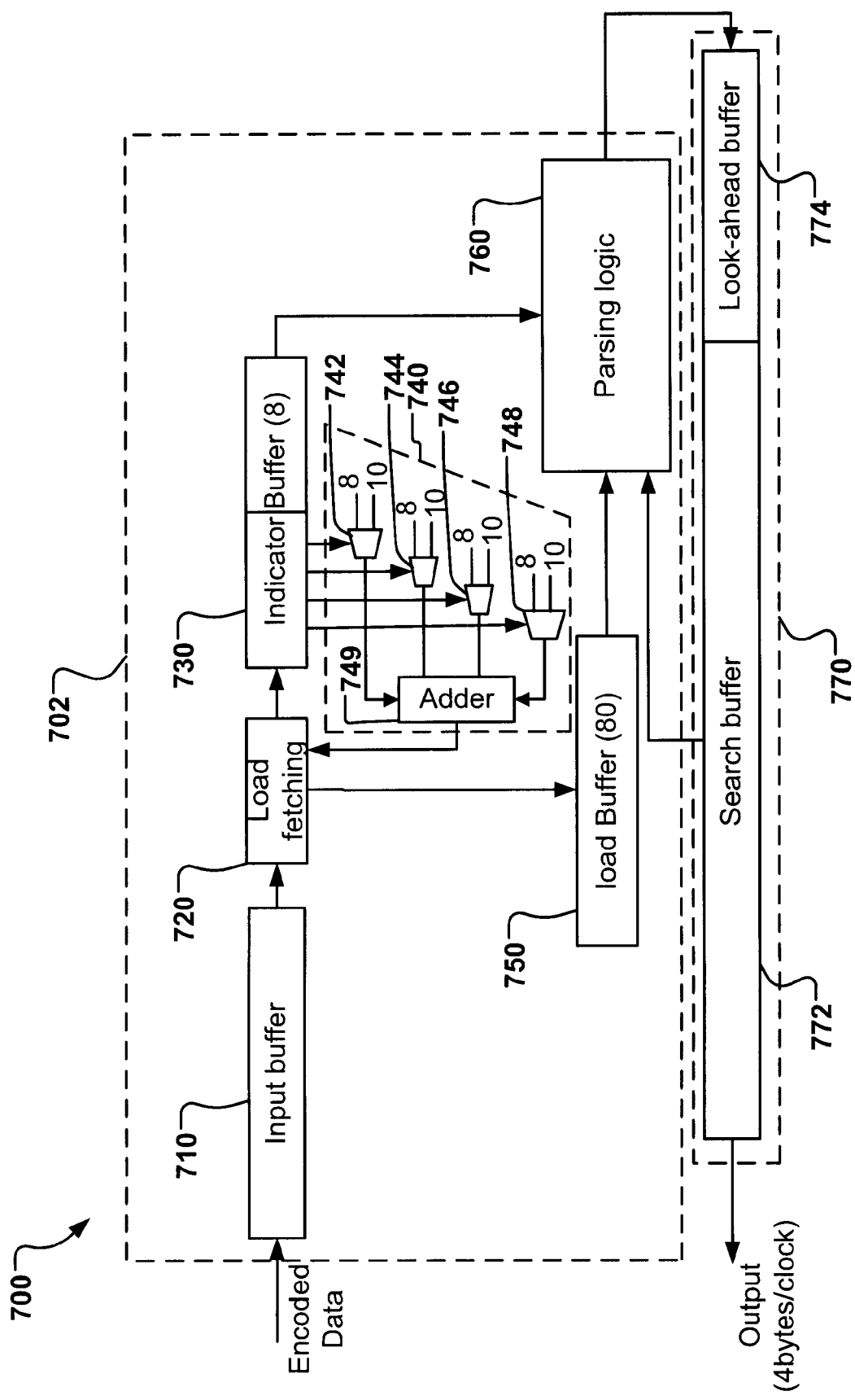
FIG. 7 is a block diagram showing an example device for performing pipelined processing of encoded data in parallel.

FIG. 7 is a block diagram showing an example device for performing pipelined processing of encoded data in parallel. The device 700 includes a decoder 702 that performs pipelined processing of encoded data in parallel. The decoder 702 can be implemented to operate in a manner consistent with the decoder 420 described with respect to FIG. 4 above. The decoder 702 can process the encoded data at a defined rate. For example, the decoder 702 can update a memory module 770 by 4 symbols or bytes every clock cycle. To update the memory module 770 by 4 symbols or bytes at a given clock cycle, the decoder 702 can process from 0 to 4 codewords. The decoder 702 can be implemented as a device separate from the encoder 410. Also, the decoder 702 and the encoder 410 can be implemented together in a single apparatus.

The decoder 702 can include an input buffer 710, a load fetching logic unit 720, an indicator buffer 730, a load determining unit 740, a load buffer 750 and a parsing logic unit 760. The decoder 702 can communicate with the memory module 770 to access a search buffer portion 772 and a look-ahead buffer portion 774. The search buffer portion 772 and the look-ahead buffer portion 774 can be implemented as separate buffers or as different regions of a single buffer. Additionally, the memory module 770 can be implemented as being separate from the memory module 120 or as the same memory module. When implemented as the same memory module, the encoder 410 and the decoder 702 can share the single memory module.

The input buffer 710 receives encoded data to be decompressed. The load fetching logic unit 720 fetches a defined number of codewords and shifts the fetched codewords into the indicator buffer 730. For a 4-bytes or symbols per clock cycle processing rate, the load fetching logic unit 720 can shift in 4 codewords per clock cycle. The load determining unit 740 determines the load (e.g., total number of bits to process) for the codewords stored in the indicator buffer 730. The number of bits to process for each codeword can be determined by processing the corresponding indicator bits. For example, the load determining unit 740 can include multiplexers 742, 744, 746 and 748 to process the corresponding indicator bits. The first multiplexer 742 can process the first indicator bit in the indicator buffer 730 and determine whether to process 8 bits or 10 bits. If the indicator bit is '0', then the next chunk of data is a literal symbol or byte or 8 bits. If the indicator bit is '1', then the next chunk of data is a length-location pair, which corresponds to 10 bits. To determine the total number of bits to process, the load determining unit 740 determines the number of bits to process for each codeword and sums them up using an adder 749, for example.

The load fetching logic unit 720 receives the determined load amount from the load determining unit 740, and loads the determined number of bits from the input buffer 710 to the load buffer 750. For example, if all four of the indicators were '1', then the total number of bits to process for the corresponding 4 codewords is 40 bits. The load fetching logic unit 720 can load 40 bits starting from a given pointer into the load buffer 750.

The parsing logic unit 760 decodes the loaded bits in the load buffer 750 and updates the memory module 770 at the defined rate. In the example shown in FIG. 7, the parsing logic unit 760 updates the memory module 770 4 symbols or bytes per clock cycle. The parsing logic unit 760 is described further with respect to FIG. 10 below.

Figure 8:
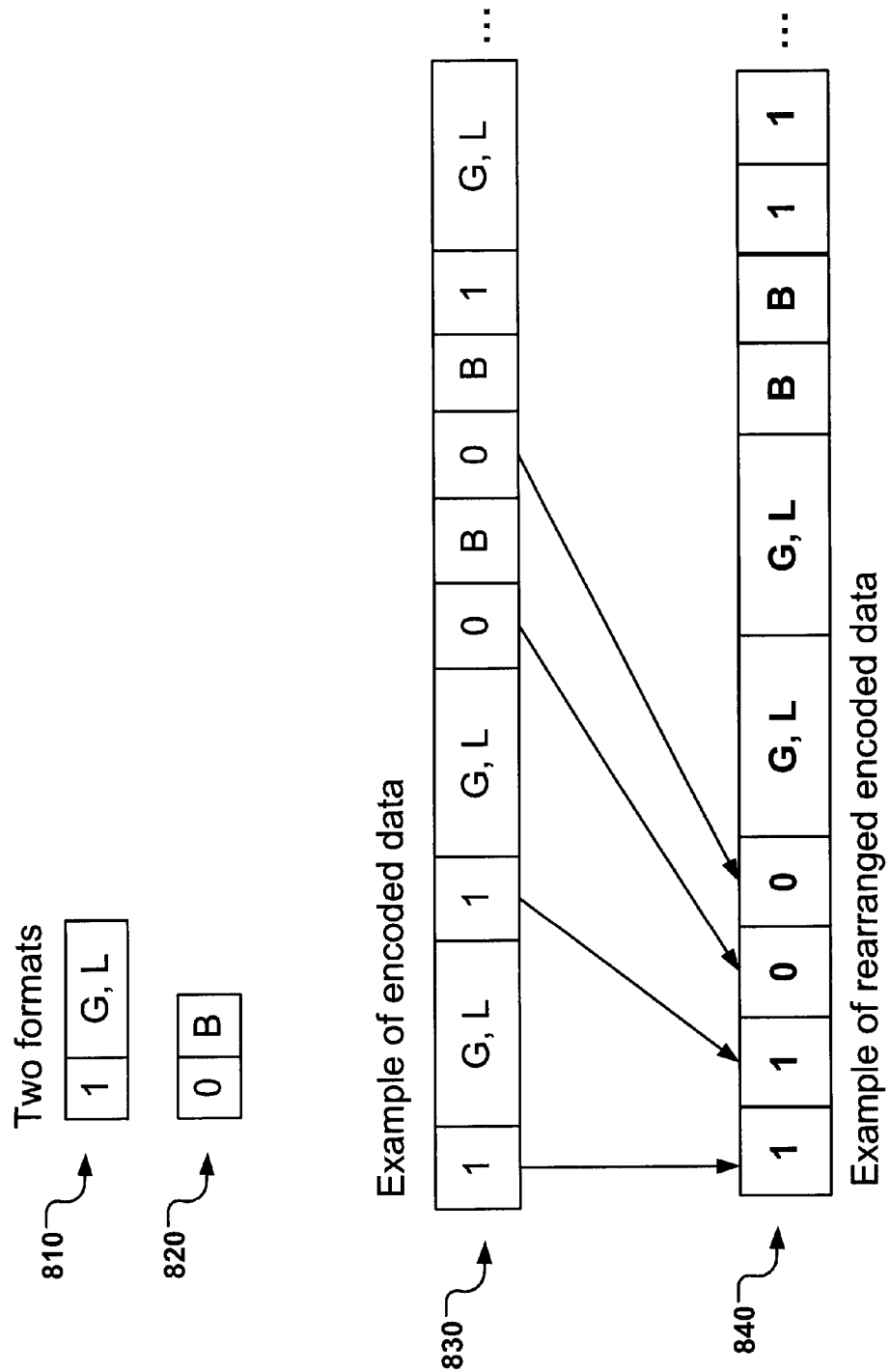
FIG. 8 shows different data structures for encoded data.

FIG. 8 shows different data structures for encoded data. As described above, the encoded data can be represented using two different codewords: <0, B> 820 and <1, G, L> 810. During data encoding, when a match is not found, the codeword <0, B> 820 is used to encode a literal symbol or byte, which is not compressed. The literal symbol or byte takes up 8 bits of data. When a match is found during data encoding, the data is encoded using the length and location of the matched data. To encode the length and location information, 10 symbols or bytes can be used.

The encoded data can include a mixture of the two codeword types. To decompress the encoded data, a decoder (e.g., 702) can parse the encoded data to identify the indicator bits (or the flag bits). The decoder can use the indicator bits to determine the remainder of bits in the encoded data. For the example encoded data 830 shown in FIG. 8, the first bit is an indicator bit of '1,' which indicates that the next chunk of data is a length-location pair that takes up 10 bits of data. Thus, the decoder can determine that the next indicator bit is eleven bits away. The decoder skips the next ten bits and selects the 11$^{th}$ bit as the next indicator bit. In the example shown in FIG. 8, the next indicator bit is '1.' Again, the decoder determines that the next indicator bit is 11 bits away. The third indicator bit of '0' indicates that the next chunk of data is a literal symbol or byte, which takes up 8 bits. The decoder determines that the fourth indicator bit is 9 bits away. The fourth indicator bit is also '0' and thus the decoder determines that the fifth indicator bit is 9 bits away. The indicator bit parsing continues until all of the encoded data is processed.

The encoded data can have codewords placed next to each other as shown in the data structure 830. Also, the encoded data 830 can be rearranged to have a different data structure 840 that bundles a defined number of codewords together. The bundled codewords are rearranged to have the indicator bits positioned next to each other in sequence. Then the remaining elements of the bundled codewords (literal byte, length-location pair or both) are placed after the string of indicator bits. The defined number of codewords in a bundle can be set based on the data processing rate. For example, the encoded data can be bundled 4 codewords at a time for a 4-symbols or bytes per clock cycle throughout rate. For 8-bytes or symbols per clock cycle, 8 codewords can be bundled together. After the bundled indicators are read, the number of bits to be processed can be determined. As described above, the number of bits to process depends on the indicator bits read. For the example shown in FIG. 8, the first 4 codewords are bundled to have a string of indicator bits '1, 1, 0, 0.' This translates into 36 bits total (8+8+10+10) to process for the 4 bundled codewords. Next group of indicators can then be processed in a pipeline structure.

If the decoder processes 4 codewords at a time based on the same buffer, some of the codewords may be decoded using the outdated search-buffer content. Incorrect decoding can be discarded by counting the total number of symbols or bytes processed so far.

Figure 9:
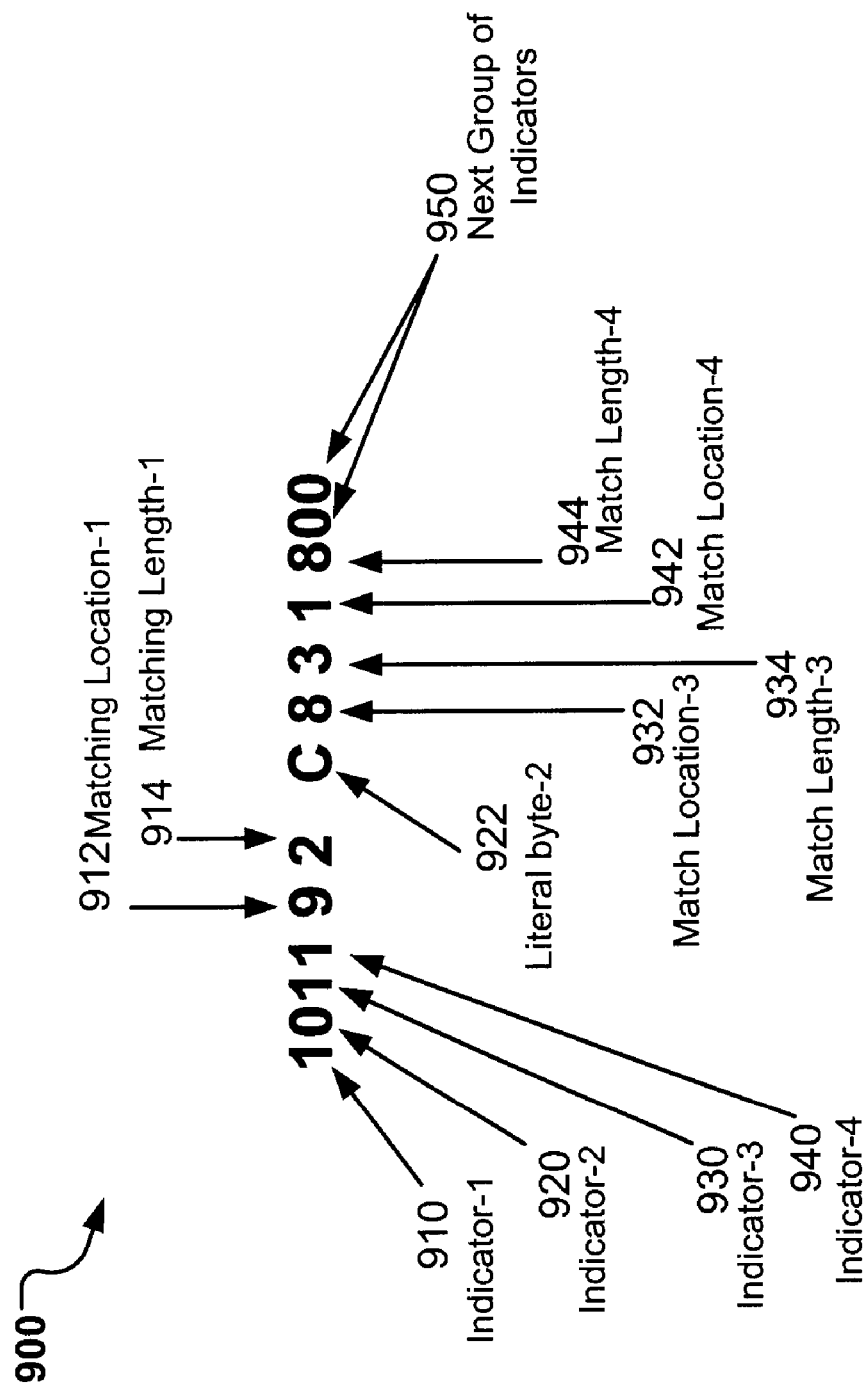
FIG. 9 shows an example of a bundled string of encoded data.

FIG. 9 shows an example of a bundled string of encoded data. The bundled encoded data 900 is arranged to have the indicator bits positioned together followed by the remaining elements of the codewords. In the example shown in FIG. 9, four codewords are bundled together with four indicator bits 910, 920, 930 and 940 arranged together. The next chunk of data is a length-location pair 912 and 914 that correspond to the first indicator bit 910. The next chunk of data is a literal symbol or byte 922 that corresponds to the second indicator bit 920. The next chunk of data is a length-location pair 932 and 934 that correspond to the third indicator bit 930. The next chunk of data is another length-location pair 942 and 944 that correspond to the fourth indicator bit 940. Then the next group of indicator bits 950 is shown.

The encoder can calculate the accumulated output symbols or bytes for the encoded data, and process the corresponding codewords based on the same buffer until the accumulated symbols or bytes exceed the defined rate. In the examples shown in FIG. 9, the defined rate is 4 symbols or bytes per clock cycle. The first indicator 910 is '1,' which indicates a match. The corresponding length element 912 is '2.' The accumulated total output symbols or bytes equal 2 symbols or bytes after the first codeword. Because the accumulated 2 symbols or bytes does not exceeded 4 symbols or bytes (the defined rate), the first codeword is valid and can be decoded using the current buffer. The second indicator 920 is '0,' which indicates no-match. The next chunk of data is a literal symbol or byte. The accumulated output symbols or bytes equal 3 symbols or bytes (2+1), which does not exceed 4 symbols or bytes. The second codeword can also be processed using the same buffer. The third indicator bit 930 is '1.' The corresponding length 1032 is '3' and the accumulated output symbols or bytes equal 7 symbols or bytes (2+1+3). The accumulated 7 symbols or bytes exceed 4 symbol or bytes. Thus, the third codeword is the last codeword that can be processed using the same buffer. The fourth indicator bit is '1' and the corresponding length is '8.' The accumulated output symbols or bytes are now 14 symbols or bytes (2+1+3+8). Thus, the first 3 codewords are valid using the current buffer while the 4$^{th}$ codeword is invalid and cannot be processed until the next clock cycle and after the current buffer is updated.

After a given bundle of codewords is processed, the decoded symbols or bytes may exceed the defined rate (e.g., 4 symbols or bytes per clock cycle), exceeding the buffer updating period. The residual bits are taken into account in the next batch processing. For the example shown in FIG. 9, the first 3 codewords have 6 symbols or bytes processed or decoded. The memory module is advanced by 4 symbols or bytes in one clock cycle, which leaves 2 residual symbols or bytes leftover. The 2 residual symbols or bytes are carried over to the next batch processing (e.g., pipelined processing). The fourth codeword has 8 symbols or bytes that match (2+8>4). The decoder updates the memory module twice (8 symbols or bytes total) before the next batch processing. Again, there are 2 residual symbols or bytes leftover for the next batch processing.

Figure 10:
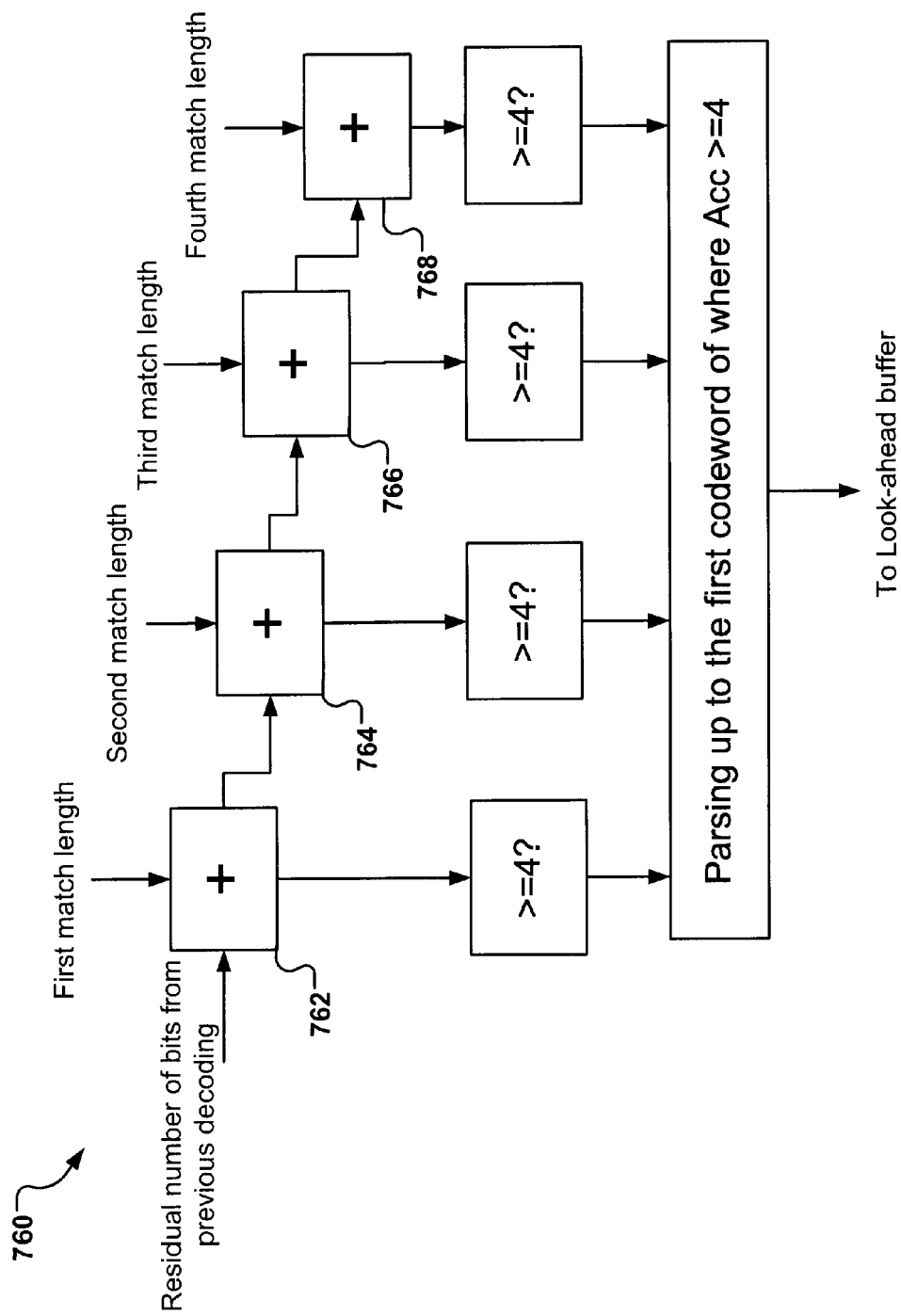
FIG. 10 shows an implementation of a parsing logic unit.

FIG. 10 shows an implementation of a parsing logic unit. The parsing logic unit 760 can process a defined number of codewords per clock cycle (e.g., 4 codewords per clock cycle). For a given clock cycle, the parsing logic unit 760 can obtain 4 indicator bits from the indicator-bit buffer 730 to process. To determine whether any of the codewords can be processed in a given clock cycle, the parsing logic unit 760 can include an accumulating unit, such as adders 762, 764, 766 and 768 to accumulate the symbols or bytes to be processed for the codewords.

For example, the residual number of symbols or bytes from previous clock processing is accumulated with the number of symbols or bytes to process for a first codeword to obtain a first accumulated total. The first accumulated total is added to the number of symbols or bytes to process for the second codeword to obtain a second accumulated total. The second accumulated total is added to the number of symbols or bytes to process for the third codeword to obtain a third accumulated total. The third accumulated total is added to the number of symbols or bytes to process for the fourth codeword to obtain a fourth accumulated total. The parsing logic unit 760 processes the accumulated totals to determine whether any of the totals exceeds the defined rate. The parsing logic unit 760 processes up to the first codeword associated with the first total that exceeds or equals the defined rate. For the example shown in FIG. 9, the third codeword is the first codeword associated with the accumulated total that equals or exceeds the defined rate of 4 symbols or bytes per clock cycle.

For a given clock cycle, the indicator buffer 730 can overflow if the number of indicators shifted-in exceeds the number of indicators processed. For example, if the indicator buffer 730 receives 4 additional indicator bits at a given clock cycle but the previously received 4 indicators bits have not all been processed, the indicator buffer 730 can overflow. To prevent buffer overflow, the indicator buffer 730 can be monitored to delay shifting-in the next group of codewords until the indicator buffer 730 is holding less than or equal to 4 indicator bits. The load corresponding to the next group of codewords is shifted into the load buffer 750 responsive to shifting-in the next group of codewords.

Figure 11A:
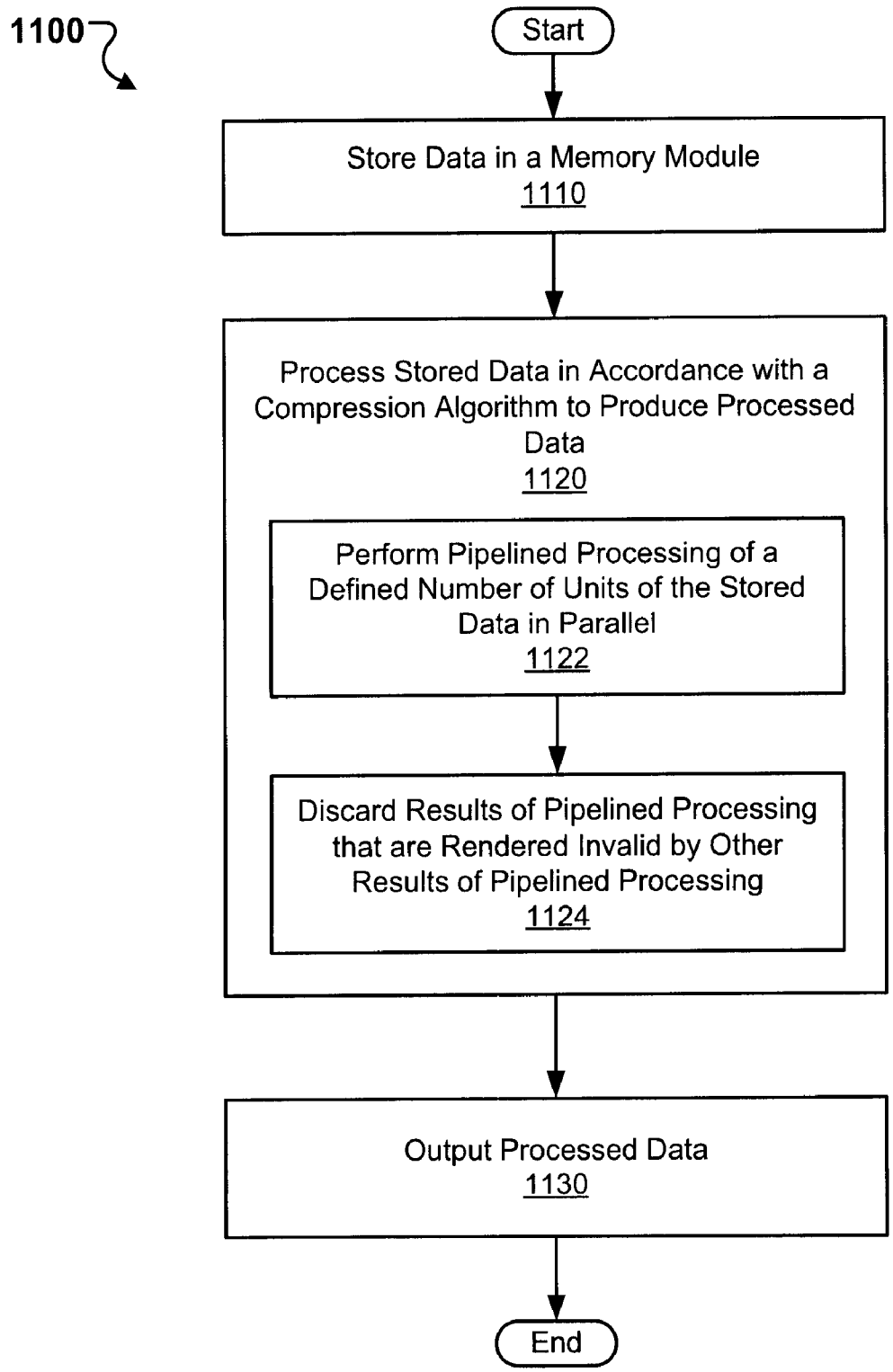

FIGS. 11A, 11B, 11C, 11D, 11E, 11F, 11G, 11H, 11I, 11J, 11K and 11L are process flow diagrams showing implementations of a process 1100 for performing data compression and decompression using pipelined processing. FIG. 11A shows a pipelined processing applicable for both data compression and decompression. FIGS. 11B, 11C and 11D show implementations of a pipelined processing applicable for data compression. FIGS. 11E, 11F, 11G, 11H, 11I, 11J, 11K and 11L show implementations of a pipelined processing applicable for data decompression.

FIG. 11A shows a process for performing pipelined processing applicable for both data compression and data decompression. At 1110, an encoder or decoder (e.g., encoder 410 or decoder 702) can store data in a memory module. At 1120, the encoder or decoder can process the stored data in accordance with a compression/decompression algorithm to produce processed data. At 1122, when processing the stored data, the encoder or decoder can perform pipelined processing of a defined number of units of the stored data in parallel. At 1124, when processing the stored data, the encoder or decoder can discard results of the pipelined processing that are rendered invalid by other results of the pipelined processing. At 1130, the encoder or decoder can output the processed data.

FIG. 11B shows a process of storing data in a memory module for a data compression implementation. At 1112, when storing the data in a memory module, the encoder can store encoded symbols of data in a first buffer portion of the memory module. At 1114, when storing the data in a memory module, the encoder can store symbols of the data to be encoded in a second buffer portion of the memory module.

FIG. 11C shows an implementation of pipelined processing of a defined number of units of stored data in parallel for data compression. At 1126, when performing pipelined processing of a defined number of units of the stored data in parallel, the encoder can compare in parallel multiple strings of symbols in the second buffer portion with the encoded symbols in the first buffer portion to generate corresponding multiple comparison results. At 1128, when performing pipelined processing of a defined number of units of the stored data in parallel, the encoder can determine validity of the multiple comparison results. A given comparison result is valid when the given comparison result does not include a symbol encoded using a previous valid comparison result. At 1129, when performing pipelined processing of a defined number of units of the stored data in parallel, the encoder can encode the symbols in the second buffer portion using determined valid comparison results.

A quantity of the strings of symbols in the second buffer portion can correspond to the defined rate. Also, a given valid comparison result can include a comparison codeword that identifies one or more symbols to be encoded. The comparison codeword can include a flag bit that indicates whether a string of encoded symbols in the first buffer portion matches at least two symbols in the corresponding string of symbols; and a literal symbol or byte or a location-length pair that indicates a starting position of the string of encoded symbols in the first buffer portion that match at least two symbols in the corresponding string of symbols and a length of the string of encoded symbols. Additionally, the strings of symbols can include different starting positions in the second buffer.

FIG. 11D shows an implementation of selecting a defined number of received multiple codewords to process in parallel at the encoder. At 1150, when selecting a defined number of the codewords, the encoder can bundle the received codewords together to include the defined number of codewords. At 1152, when selecting a defined number of the codewords, the encoder can rearrange bits of the bundled codewords to group the indicator bits together followed by remaining bits that include the literal byte, the location-length pair or both.

FIG. 11E shows an implementation of storing data in a memory module for data decompression. At 1116, when storing the data in a memory module, a decoder (e.g., decoder 420 or 702) can store decoded symbols of compressed data in a first buffer portion of the memory module. At 1118, when storing the data in a memory module, the decoder can store symbols of the compressed data to be decoded in a third separate buffer that includes the indicator buffer and load buffer, which stores the received compressed codewords.

Figure 11F:
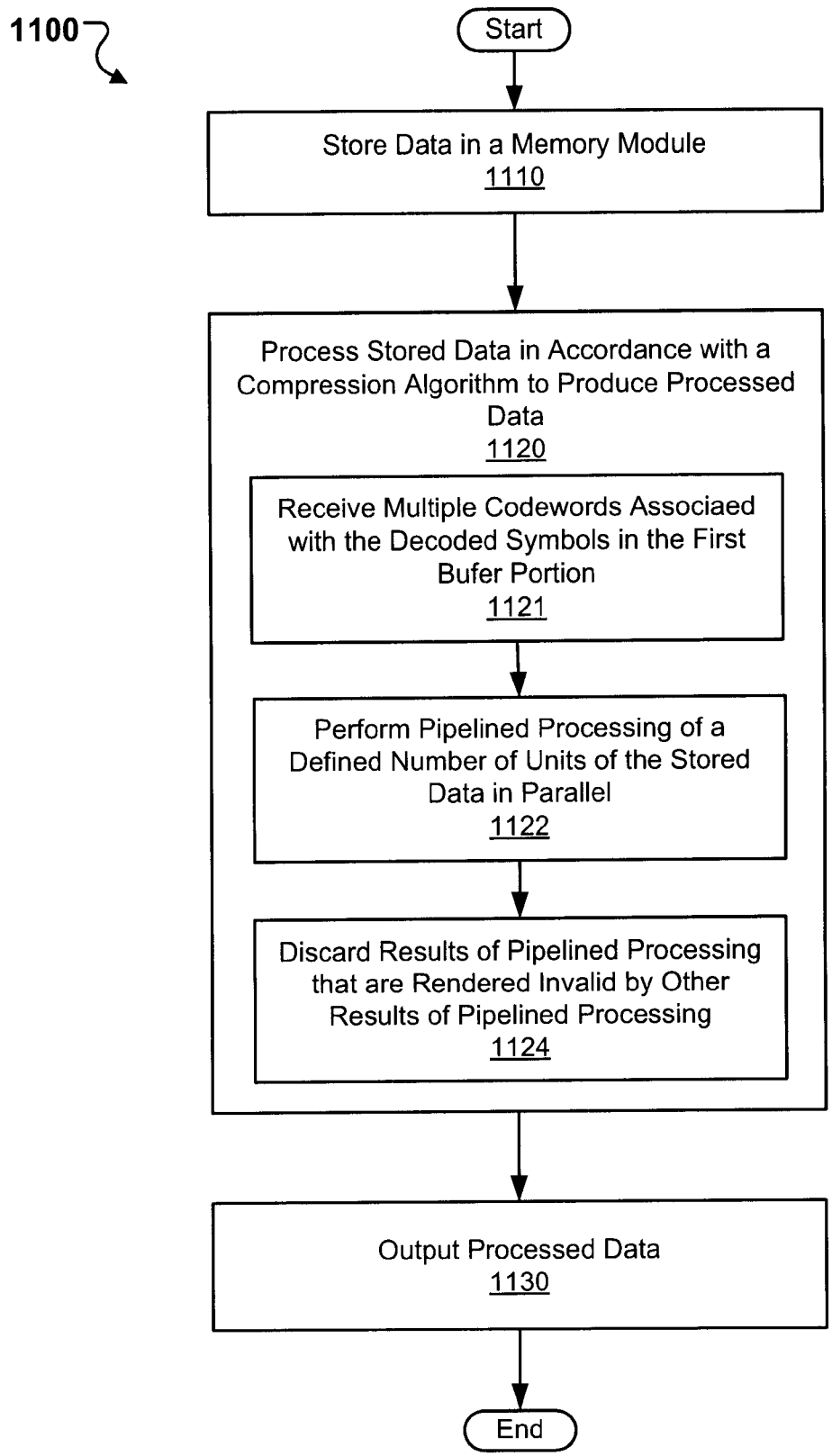

FIG. 11F shows an implementation of processing stored data in accordance with a compression algorithm to produce processed data for data decompression. At 1121, when processing the stored data, the decoder can receive multiple codewords associated with the decoded symbols in the first buffer portion. A given codeword can include an indicator bit that indicates whether next data is a literal symbol or byte or a location-length pair that represents a starting location and a length of a pattern of decoded symbols in the first buffer portion to output as decompressed data.

Figure 11G:
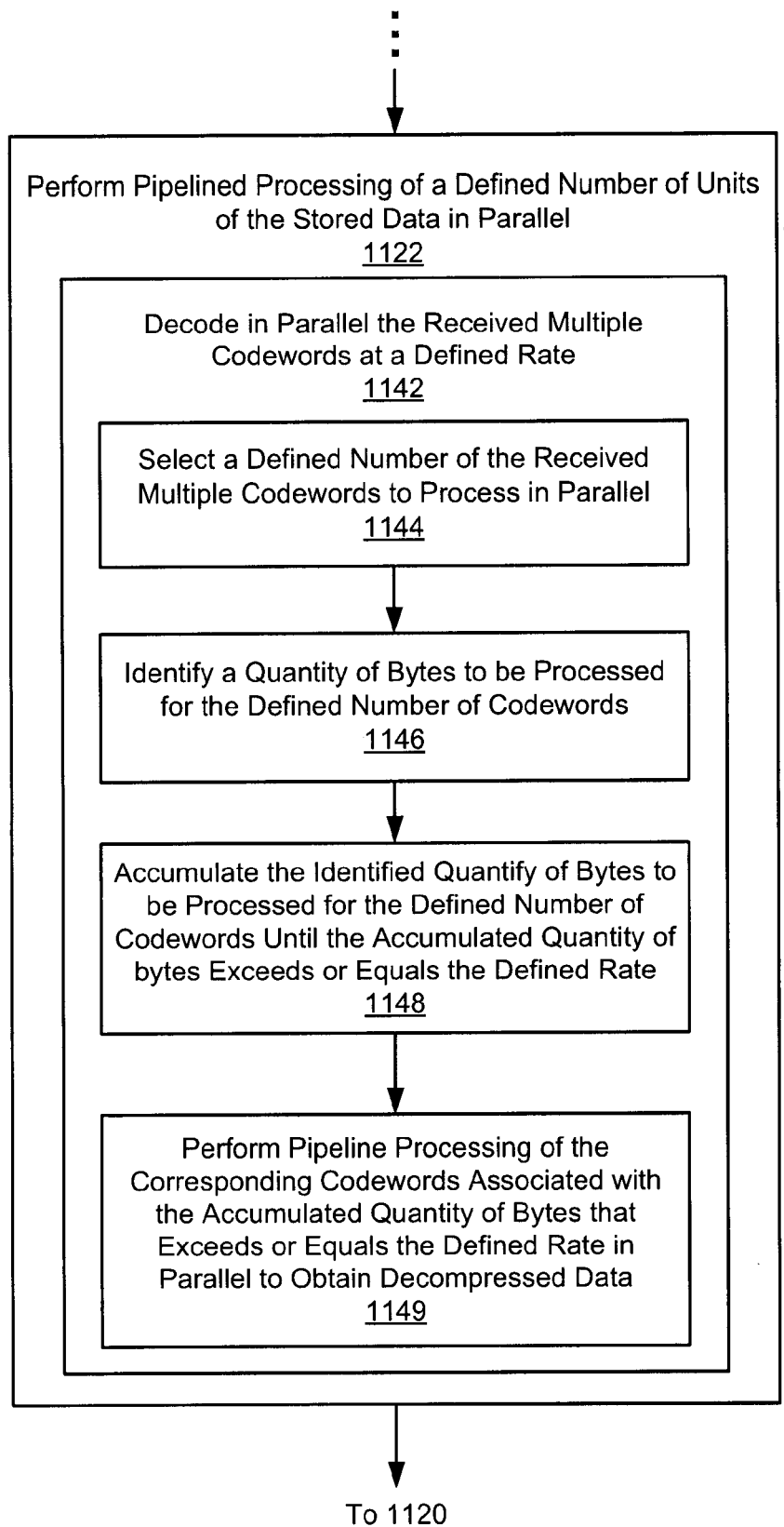

FIG. 11G shows an implementation of pipelined processing of a defined number of units of the stored data in parallel for data decompression. At 1142, when performing pipelined processing of a defined number of units of the stored data in parallel, the decoder can decode in parallel the received multiple codewords at a defined rate. At 1144, when decoding in parallel the received multiple codewords at a defined rate, the decoder can select a defined number of the received multiple codewords to process in parallel. The defined number can be associated with the defined rate. At 1146, when decoding in parallel the received multiple codewords at a defined rate, the decoder can identify a quantity of bytes/symbols to be processed for the defined number of codewords. At 1148, when decoding in parallel the received multiple codewords at a defined rate, the decoder can accumulate the identified quantity of symbols or bytes to be processed for the defined number of codewords until the accumulated quantity of symbols or bytes exceeds or equals the defined rate. At 1149, when decoding in parallel the received multiple codewords at a defined rate, the decoder can perform pipelined processing of the corresponding codewords associated with the accumulated quantity of symbols or bytes that exceeds or equals the defined rate in parallel to obtain decompressed data.

Figure 11H:
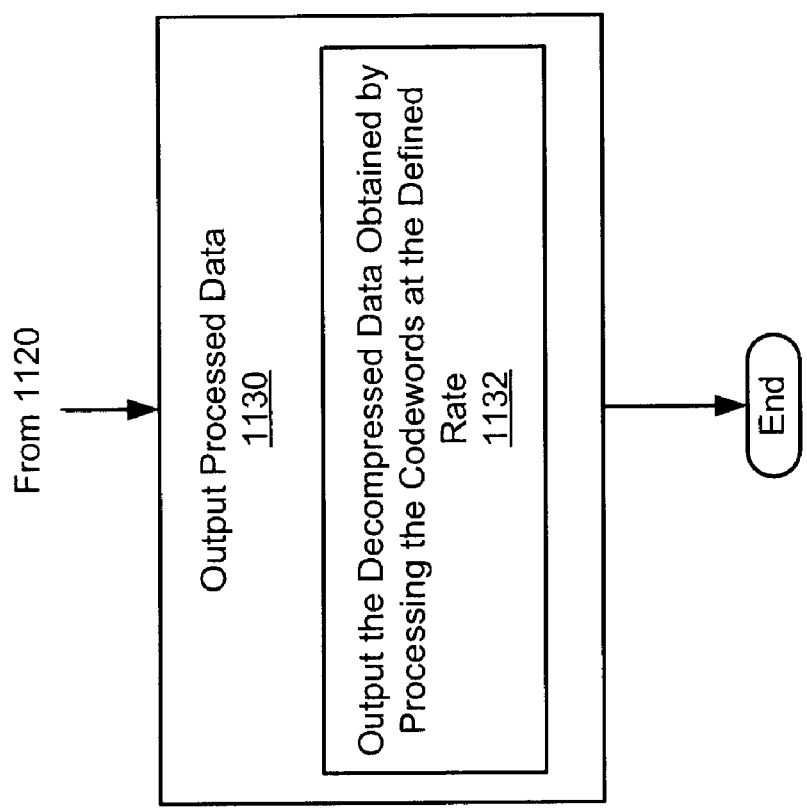

FIG. 11H shows an implementation of outputting processed data for data decompression. At 1132, when outputting the processed data, the encoder can output the decompressed data obtained by processing the codewords at the defined rate.

FIG. 11I shows an implementation of pipelined processing of corresponding codewords associated with accumulated quantity of symbols or bytes that exceeds or equals defined rate in parallel to obtain decompressed data. At 1154, when performing pipelined processing of the corresponding codewords associated with the accumulated quantity of symbols or bytes that exceeds or equals the defined rate in parallel, the decoder can identify corresponding decoded symbols in the first buffer portion indicated by the location-length pair, the literal symbol or byte or both in the corresponding codewords.

FIG. 11J shows an implementation of pipelined processing of a defined number of units of stored data in parallel for data decompression. At 1156, when performing pipelined processing of a defined number of units of the stored data in parallel, the decoder can delay processing any remaining codeword in the defined number of codewords until next clock cycle.

Figure 11K:
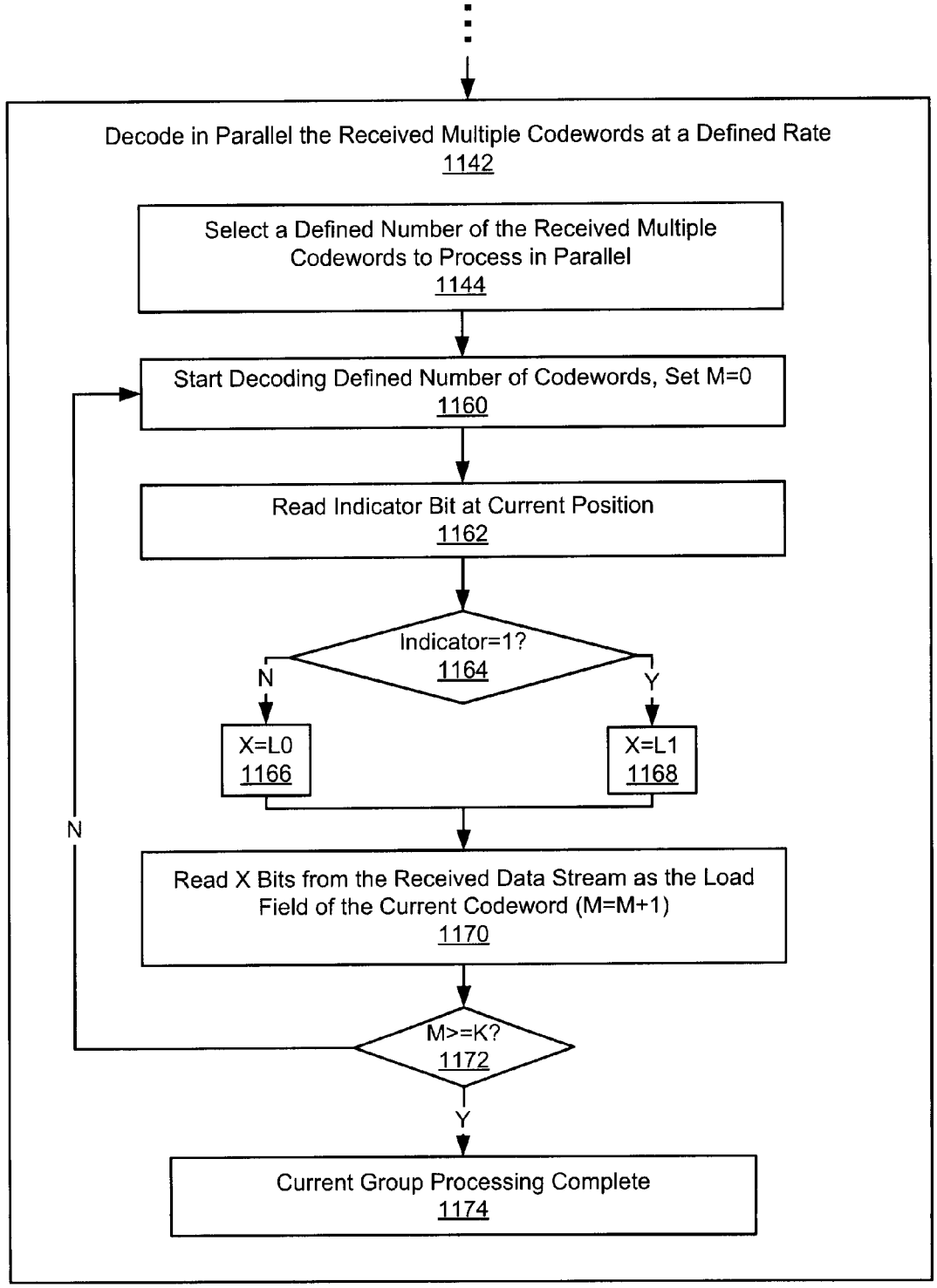

FIG. 11K shows a process for decoding in parallel the received multiple codewords at a defined rate. At 1144, the decoder can select a defined number of received multiple codewords to process in parallel. At 1160, the decoder can start decoding a defined number of codewords from the received encoded data. For example, when processing 4 symbols or bytes per clock cycle, the decoder can start decoding 4 codewords in parallel. At 1162, the decoder can read the indicator bit starting from the current pointer position, with the pointer pointing to the receiving data stream. The decoder can read the indicator bit to determine the length of the load field. Subsequent to reading the indicator bit, the decoder can move the pointer forward by 1 bit. At 1164, the decoder can determine whether the read indicator bit is '0' or '1.' At 1166, the decoder can set the length of the load as L0 corresponding to the length of one literal symbols or byte (e.g., L0=8) when the indicator bit is '0.' At 1168, the decoder can set the length of the load as L1 corresponding to the length of the Location-Length pair (e.g., L1=10) when the indicator bit is '1.'

At 1170, the decoder can read X bits from the received encoded data, with X being the length of the load field of the current codeword. Then the decoder can move the pointer X bits forward. At 1172, the decoder can determine whether a desired number (K) of codewords has been processed. The desired number (K) of codewords can depend on the defined number of parallelization (e.g., K can equal 4 codewords processed in parallel). At 1174, the decoder terminates the current group processing when the desired number of codewords has been processed (e.g., M>=4). When the desired number of parallelization has not been reached, the decoder can continue to process additional codewords.

Figure 11L:
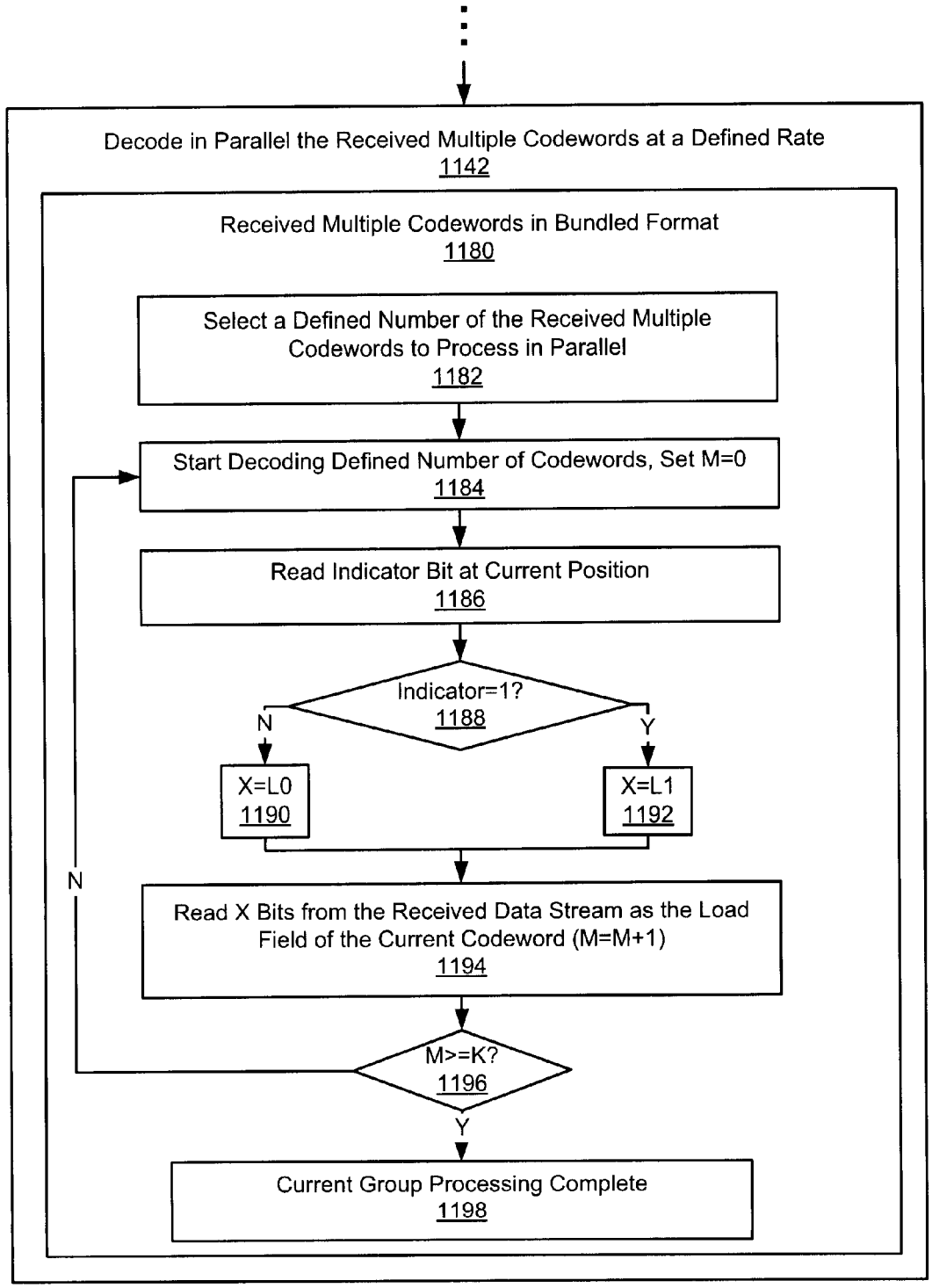

FIG. 11L shows a process for decoding in Parallel the received multiple codewords at a defined rate. FIG. 11L is similar to FIG. 11K except that the received data stream is in a bundled format. At 1180, the received data stream (e.g., the received multiple codewords) can be received in a bundled format as described above with respect to FIG. 8, reference number 840 and FIG. 11D. At 1182, the decoder can select a defined number of received multiple codewords to process in parallel. At 1184, the decoder can start decoding a defined number of codewords from the received encoded data. For example, when processing 4 symbols or bytes per clock cycle, the decoder can start decoding 4 codewords in parallel. At 1186, the decoder can read the indicator bit starting from the current pointer position, with the pointer pointing to the receiving data stream. The decoder can read the indicator bit to determine the length of the load field. Subsequent to reading the indicator bit, the decoder can move the pointer forward by 1 bit. At 1188, the decoder can determine whether the read indicator bit is '0' or '1.' At 1190, the decoder can set the length of the load as L0 corresponding to the length of one literal symbols or byte (e.g., L0=8) when the indicator bit is '0.' At 1192, the decoder can set the length of the load as L1 corresponding to the length of the Location-Length pair (e.g., L1=10) when the indicator bit is '1.'

At 1194, the decoder can read X bits from the received encoded data, with X being the length of the load field of the current codeword. Then the decoder can move the pointer X bits forward. At 1196, the decoder can determine whether a desired number (K) of codewords has been processed. The desired number (K) of codewords can depend on the defined number of parallelization (e.g., K can equal 4 codewords processed in parallel). At 1198, the decoder terminates the current group processing when the desired number of codewords has been processed (e.g., M>=4). When the desired number of parallelization has not been reached, the decoder can continue to process additional codewords.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. A method performed by a data processing device, the method comprising:
   storing data in a memory module;
   processing the stored data in accordance with a compression algorithm to produce processed data;
   where the processing comprises
      pipelined processing of a defined number of symbols of the stored data in parallel, and
      discarding results of the pipelined processing that are rendered invalid by other results of the pipelined processing; and
   outputting the processed data.

2. The method of claim 1,
   wherein the storing data in a memory module comprises:
      storing encoded symbols of data in a first buffer portion of the memory module, and
      storing symbols of data to be encoded in a second buffer portion of the memory module; and
   wherein the pipelined processing of a defined number of symbols of the stored data in parallel comprises:
      comparing in parallel multiple strings of symbols in the second buffer portion with the encoded symbols in the first buffer portion to generate corresponding multiple comparison results,
      determining validity of the multiple comparison results, wherein a given comparison result is valid when the given comparison result does not include a symbol encoded using a previous valid comparison result, and
      encoding the symbols in the second buffer portion using a determined valid comparison result.

3. The method of claim 2, wherein a quantity of the strings of symbols in the second buffer portion corresponds to a defined rate.

4. The method of claim 2, wherein a given valid comparison result comprises a comparison codeword that identifies one or more symbols to be encoded.

5. The method of claim 2, wherein the strings of symbols comprise:
   different starting positions in the second buffer portion.

6. The method of claim 2, further comprising:
   bundling the encoded symbols together to include a defined number of codewords; and
   rearranging bits of the bundled encoded symbols to group indicator bits together followed by remaining bits that include a literal symbol, a location-length pair or both.

7. The method of claim 1,
   wherein the storing data in a memory module comprises:
      storing decoded symbols of compressed data in a first buffer portion of the memory module, and
      storing symbols of compressed data to be decoded in a second buffer portion of the memory module; and
   wherein the processing the stored data in accordance with a compression algorithm to produce processed data comprises:
      receiving multiple codewords associated with the decoded symbols in the first buffer portion, wherein a given codeword comprises an indicator bit that indicates whether next data is a literal symbol or a location-length pair that represents a starting location and a length of a pattern of decoded symbols in the first buffer portion to output as decompressed data.

8. The method of claim 6,
   wherein the pipelined processing of a defined number of symbols of the stored data in parallel comprises
      decoding in parallel the received multiple codewords at a defined rate, the method further comprising:
         selecting a defined number of the received multiple codewords to process in parallel, wherein the defined number of the received multiple codewords is associated with the defined rate,
         identifying a quantity of symbols to be processed for the defined number of codewords,
         accumulating the identified quantity of symbols to be processed for the defined number of codewords until the accumulated quantity of symbols equals or exceeds the defined rate, and
         pipelined processing of the corresponding codewords associated with the accumulated quantity of symbols that equals or exceeds the defined rate in parallel to obtain the decompressed data.

9. The method of claim 8, wherein outputting the processed data comprises:
   outputting the decompressed data obtained by processing the codewords at the defined rate.

10. The method of claim 8, wherein pipelined processing of the corresponding codewords associated with the accumulated quantity of symbols that equals or exceeds the defined rate in parallel comprises:
    identifying corresponding decoded symbols in the first buffer portion indicated by at least one of the location-length pair or the literal symbol in the corresponding codewords.

11. The method of claim 8, wherein the pipelined processing of a defined number of symbols of the stored data in parallel comprises:
    delaying processing any remaining codeword in the defined number of codewords until a next clock cycle.

12. A system comprising:
    a data processing device to encode data to generate compressed data, wherein the data processing device comprises:
       a memory module to store the data, wherein the memory module comprises
          a search buffer to store encoded symbols of the data, and
          a look-ahead buffer to store symbols of the data to be encoded; and
       an encoder to compress the stored data at a defined rate, wherein the encoder comprises:
          multiple comparison logic units to perform in parallel multiple comparisons between the symbols stored in the look-ahead buffer and the encoded symbols stored in the search buffer and generate corresponding comparison results, and
          a comparison arbitration logic unit to
             determine validity of the multiple comparisons, wherein a given comparison result is valid when the given comparison result does not include data encoded by a previous valid comparison result, and encode the symbols stored in the look-ahead buffer using determined valid comparison results; and
    a storage device to store the compressed data.

13. The system of claim 12, wherein the encoder is configured to:
rearrange bits of the encoded symbols to place indicator bits together followed by remaining bits that include a literal byte, a location-length pair or both.

14. The system of claim 12, wherein a quantity of the symbols in the look-ahead buffer corresponds to the defined rate.

15. The system of claim 12, wherein a given valid comparison result comprises a comparison codeword that identifies one or more symbols to be encoded.

16. The system of claim 12, further comprising:
a data processing device to decode the compressed data using pipelined processing.

17. The system of claim 16, wherein the data processing device to decode the compressed data comprises:
a decoder memory module to store decoded symbols of the compressed data and symbols of the compressed data to be decoded, wherein the decoder memory module comprises:
a first buffer portion to store the decoded symbols of the compressed data, and
a second buffer portion to store the symbols of the compressed data to be decoded; and
a decoder to decompress the stored compressed data at a defined decompression rate, wherein the decoder comprises:
an input buffer to receive codewords associated with decoded symbols of the compressed data, wherein a given codeword comprises an indicator bit that indicates whether next data is a literal symbol or a location-length pair that represents a starting location and a length of a pattern of symbols in the first buffer portion as decoded by the given codeword,
a load fetching logic unit to obtain a group of the codewords from the input buffer,
an indicator bit buffer to store the indicator bits associated with the group of codewords obtained by the load fetching logic unit,
a load determining unit to determine a quantity of symbols to process for the group of codewords,
a load buffer to receive the determined quantity of symbols to process for the group of codewords obtained by the load fetching logic unit, and
a parsing logic unit to communicate with the load buffer and the indicator bit buffer to decode in parallel the determined quantity of symbols to process for the group of codewords in the load buffer.

18. An apparatus comprising:
a memory module to store data, wherein the memory module comprises
a first buffer portion to store decoded symbols of the data, and
a second buffer portion to store symbols of the data to be decoded; and
a decoder to decompress the stored data at a defined rate, wherein the decoder comprises:
an input buffer to receive codewords associated with decoded symbols of the data, wherein a given codeword comprises an indicator bit that indicates whether next data is a literal byte or a location-length pair that represents a starting location and a length of a pattern of symbols in the first buffer portion as decoded by the given codeword,
a load fetching logic unit to obtain a group of the codewords from the input buffer,
an indicator bit buffer to store the indicator bits associated with the group of codewords obtained by the load fetching logic unit,
a load determining unit to determine a quantity of bits to process for the group of codewords,
a load buffer to receive the determined quantity of bits to process for the group of codewords obtained by the load fetching logic unit, and
a parsing logic unit to communicate with the load buffer and the indicator bit buffer to decode in parallel the determined quantity of bits to process for the group of codewords in the load buffer.

19. The apparatus of claim 18, wherein the parsing logic unit is configured to:
accumulate the quantity of symbols to be processed for the group of codewords until the accumulated quantity of symbols exceeds or equals the defined rate, and
pipelined processing of the corresponding codewords associated with the accumulated quantity of symbols that exceeds or equals the defined rate in parallel to obtain decompressed data.

20. The apparatus of claim 18, wherein the parsing logic unit is configured to delay processing any remaining codeword in the group of codewords until a next clock cycle.

* * * * *